(12) United States Patent
Nakamura et al.

(10) Patent No.: US 7,704,799 B2
(45) Date of Patent: Apr. 27, 2010

(54) METHOD OF MANUFACTURING WIRING SUBSTRATE

(75) Inventors: Hidehiro Nakamura, Ibaraki-ken (JP);
Tetsuya Enomoto, Ibaraki-ken (JP);
Toshio Yamazaki, Ibaraki-ken (JP);
Hiroshi Kawazoe, Ibaraki-ken (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 1 day.

(21) Appl. No.: 11/683,714

(22) Filed: Mar. 8, 2007

(65) Prior Publication Data
US 2007/0161228 A1    Jul. 12, 2007

Related U.S. Application Data

(62) Division of application No. 10/203,652, filed as application No. PCT/JP01/01256 on Feb. 21, 2001, now Pat. No. 7,205,645.

(30) Foreign Application Priority Data

Feb. 28, 2000   (JP)   ................. 2000-52043

(51) Int. Cl.
*H01L 21/50*   (2006.01)
(52) U.S. Cl. ................. 438/125; 438/106; 438/107; 438/108; 438/612; 438/622
(58) Field of Classification Search ................. 438/118, 438/622, 106–128, 612
See application file for complete search history.

(56) References Cited

U.S. PATENT DOCUMENTS

| 5,045,921 A | 9/1991 | Lin et al. |
| 5,108,541 A | 4/1992 | Schneider et al. |
| 5,222,014 A | 6/1993 | Lin |
| 5,521,435 A | 5/1996 | Mizukoshi |
| 5,562,973 A | 10/1996 | Nagasaka et al. |
| 5,578,526 A | 11/1996 | Akram et al. |

(Continued)

FOREIGN PATENT DOCUMENTS

EP    0559366    9/1993

(Continued)

OTHER PUBLICATIONS

English Language Abstract JP 2000-183283.

(Continued)

*Primary Examiner*—Lynne A Gurley
*Assistant Examiner*—Samuel A Gebremariam
(74) *Attorney, Agent, or Firm*—Greenblum & Bernstein, P.L.C.

(57) ABSTRACT

A wiring substrate (1) comprises an insulating base (10) with connection holes (11), buried conductors (12) provided in the connection holes (11) without reaching a rear surface of the insulating base (10), and wiring layers 14 connected to the buried conductors (12). The buried conductors (12) thicken the wiring layers (14), and can form aligning parts (110) on the rear surface of the connection holes (11) to be used for three-dimensional mounting structure. Each wiring layer (14) includes thin terminals (14A), wirings (14B) and thick electrodes (14C). Not only the terminals (14A) and wirings (14B) but also the buried conductors (12) are raised by the same manufacturing process. A semiconductor element (2) is attached to the electrodes (14C) of the wiring substrate (1).

8 Claims, 14 Drawing Sheets

U.S. PATENT DOCUMENTS

| | | | |
|---|---|---|---|
| 5,629,835 | A | 5/1997 | Mahulikar et al. |
| 5,640,051 | A | 6/1997 | Tomura et al. |
| 5,646,828 | A | 7/1997 | Degani et al. |
| 5,668,405 | A | 9/1997 | Yamashita |
| 5,821,626 | A | 10/1998 | Ouchi et al. |
| 5,848,466 | A | 12/1998 | Viza et al. |
| 5,886,877 | A | 3/1999 | Shingai et al. |
| 6,051,878 | A | 4/2000 | Akram et al. |
| 6,107,679 | A | 8/2000 | Noguchi |
| 6,262,477 | B1 | 7/2001 | Mahulikar |
| 6,274,480 | B1 * | 8/2001 | Kubo ................. 438/633 |
| 6,316,363 | B1 * | 11/2001 | Blalock et al. ........... 438/691 |
| 6,350,957 | B1 * | 2/2002 | Shingai et al. ........... 174/254 |
| 6,356,453 | B1 | 3/2002 | Juskey et al. |
| 6,492,699 | B1 | 12/2002 | Glenn et al. |
| 6,624,061 | B2 * | 9/2003 | Aoki ................. 438/622 |
| 6,998,344 | B2 | 2/2006 | Akram et al. |
| 7,205,645 | B2 | 4/2007 | Nakamura et al. |

FOREIGN PATENT DOCUMENTS

| | | |
|---|---|---|
| EP | 0657932 | 6/1995 |
| EP | 0702404 | 3/1996 |
| EP | 0751565 | 1/1997 |
| EP | 0768712 | 4/1997 |
| JP | 4-280695 | 10/1992 |
| JP | 8-153747 | 6/1996 |
| JP | 8-236694 | 9/1996 |
| JP | 8-330352 | 12/1996 |
| JP | 9-46041 | 2/1997 |
| JP | 10-189801 | 7/1998 |
| JP | 11-145381 | 5/1999 |
| JP | 11145381 | 5/1999 |
| JP | 11-163207 | 6/1999 |
| JP | 11163207 | 6/1999 |
| JP | 11-340356 | 12/1999 |
| JP | 2000-183283 | 6/2000 |
| JP | 2001-68810 | 3/2001 |
| KR | 1998-042654 | 8/1998 |
| WO | 9422168 | 9/1994 |

OTHER PUBLICATIONS

English Language Abstract of JP 8-236694.
English Language Abstract of JP 11-145381.
English Language Abstract of JP 4-280695.
English Language Abstract of JP 8-330352.
English Language Abstract of JP 2001-68810.
English Language Abstract of JP 9-46041.
English Language Abstract of JP 11-163207.
English Language Abstract of JP 10-214893.
English Language Abstract of JP 10-189801.
English Language Abstract of JP 8-153747.
English Language Abstract of JP 11-340356.

\* cited by examiner

METHOD OF MANUFACTURING WIRING SUBSTRATE

CROSS-REFERENCE TO RELATED APPLICATION

This application is a divisional of application Ser. No. 10/203,652, which is the National Stage of International Patent Application No. PCT/JP01/01256, filed Feb. 21, 2001, and claims priority of Japanese Application No. 2000-52043, filed Feb. 28, 2000. The disclosure of application Ser. No. 10/203,652 is expressly incorporated by reference herein in its entirety.

TECHNICAL FIELD

The present invention relates to a wiring substrate, a semiconductor device in which semiconductor elements are mounted on such a wiring substrate, and a method of manufacturing the wiring substrate. More particularly, the invention relates to a wiring substrate which is preferable for high density mounting of semiconductor elements, a semiconductor device which is minimized and has a great number of terminals, and a method of manufacturing such a wiring substrate. Further, the invention relates to a wiring substrate and a semiconductor device which are preferable to three-dimensional mounting, and a method of manufacturing such a wiring substrate.

BACKGROUND ART

The tendency is toward a more improved mounting density of electronic components on a printed wiring substrate. On such a printed wiring substrate, spaces are reduced between terminals for electrically connecting the electronic elements, and between wirings extending from the terminals. In order to assure reliable connections between the terminals, between the wirings, and between the terminals and wirings, a micro-wiring technology and a multi-layered wiring technology have been remarkably developed. Further, high density mounting of electronic components such as semiconductor elements is extensively promoted by making the best use of the micro-wiring and multi-layered wiring technologies.

Generally, in a popular semiconductor element such as a resin-enapsulated semiconductor element, a bare chip is mounted on a lead frame, and the bare chip and an inner lead of the lead frame are resin-molded. The bare chip is an integrated circuit and includes passive and active elements mounted on a silicon substrate. Various methods such as a pin-insert mounting type method and a face mounting type method are available for mounting the resin-encapsulated semiconductor elements.

In the foregoing resin-encapsulated semiconductor elements, since outer leads project from a resin mold, they are very difficult to be mounted in a very packed manner. In order to overcome this problem, a semiconductor device having a multiple chip module structure (called the "MCM" hereinafter) is being the center of attention at present. In this structure, a plurality of bare chips are attached on one common printed circuit and are covered by a protective resin layer. Thereafter, the wiring substrate is attached to a lead frame, and both the bare chips and the wiring substrate are resin-molded. The bare chips are mounted on the wiring substrate using the tape-automated bonding method (TAB), chip carrier bonding method (CCB) or the like. Sometimes, bare chips are mounted on the wiring substrate using an insulating adhesive or a conductive adhesive, and bonding pads of the bare chips are electrically connected to the wiring substrate by bonding wires.

Recently, a chip size package structure (CSP) has been noted in order to improve the mounting density of electronic elements. In this structure, a bare chip is mounted on a wiring substrate which is as large as the bare chip. With a semiconductor device of the CSP structure, terminals on a front surface of a wiring substrate are electrically connected to a bonding pad of the bare chip by a primary connection electrode while terminals on a second main surface of the wiring substrate are electrically connected to an external unit using a secondary connection electrode. Solder balls, solder pastes or the like are used as the primary and second connection electrodes. Further, the foregoing semiconductor device can have a so-called three dimensional mounting structure, i.e. bare chips are arranged in a plurality of layers in a package, or a plurality of packages are laid one over after another. This further promotes high density mounting of elements.

The semiconductor device of the CSP structure seems to have the following problems.

(1) Terminals provided on the wiring substrate and wirings extending from these terminals tend to be arranged with reduced pitches therebetween, and are made of thin films having a thickness in the order of μm. If a connection electrode, e.g. a solder ball having a thickness in the order of millimeters (mm), is provided on such a thin film terminal used in order to arrange bare chips or packages in multiple layers, stress resultant from a thermal cycle tends to concentrate on a connecting region between the terminal and the connection electrode, so that the connecting region would be damaged. As a result, electric conductivity may be adversely affected, which makes it difficult to realize the three-dimensional mounting of elements.

(2) If the foregoing connecting region is thickened in order overcome the above-mentioned problem, micro fabrication of terminals and wirings becomes very difficult. This means that downsizing of semiconductor devices cannot be realized.

(3) When arranging bare chips or packages in multiple layers, additional parts should be used in order to align upper and lower bare chips, or upper and lower packages. This would cause an increase in the number of components, and change in the structure of the semiconductor device, a complicated structure, difficulty of downsizing the semiconductor device, and difficulty of the three-dimensional mounting of elements.

(4) Further, the addition of the aligning parts and the structure change of the semiconductor device would lead not only to an increase of manufacturing (assembling) processes, increase of manufacturing cost and product cost but also to reduced yield of the manufacturing process.

DISCLOSURE OF THE INVENTION

The present invention has been devised in order to overcome the foregoing problems of the related art, and is intended to provide a wiring substrate in which terminals can be downsized, a great number of terminals can be arranged, and elements can be three-dimensionally mounted.

Another object of the invention is to provide a semiconductor device in which terminals can be downsized, a great number of terminals are mounted in a packed state, and semiconductor elements can be three-dimensionally arranged.

A final object of the invention is to provide a method of manufacturing a wiring substrate with a reduced number of manufacturing processes. Particularly, the reduced manufacturing processes can lead to reduction in the manufacturing and product costs, and improve the manufacturing yield.

According to a first feature of the invention, there is provided a wiring substrate comprising: a conductive surface layer; a plurality of buried conductors electrically connected to the conductive surface layer on a rear surface thereof, and an insulating base having a first main surface in contact with the rear surface of the front conductive layer and a second main surface which is opposite to the first main surface and is arranged in contact with a side wall of the buried conductors. The front conductive layer is patterned in order to form a wiring, a terminal and so on on a wiring region of the first main surface of the insulating base, and an electrode for electrical connection with a bonding pad of a bare chip on a semiconductor element mounting region, a package terminal and so on.

It is preferable that the insulating base is in contact with bottoms of the buried conductors, and a distance between the bottoms and the second main surface of the insulating base is between 1 μm and 50 μm. This thickness of the insulating base is effective in facilitating processes such as polishing and so on. Alternatively, the bottoms of the buried conductors may be exposed on the insulating base. In such a case, the second main surface of the insulating base may be flush with the bottoms of the buried conductors, or the bottoms of the buried conductors may project compared with the second main surface of the insulating base.

In accordance with a second feature of the invention, there is provided a wiring substrate comprising: an insulating base having a wiring region and a semiconductor element mounting region; a connection hole formed in the wiring region and extending between the first and second main surfaces of the insulating base; and a wiring layer which has one end thereof connected to each connection hole on the first main surface of the insulating base and the other end thereof positioned on the semiconductor element mounting region.

The wiring region and the semiconductor element mounting region are flush with each other but are at different positions. For instance, the semiconductor element mounting region may be positioned between wiring regions, or the semiconductor element mounting region may be surrounded by the wiring region. The first main surface is opposite to the second main surface, and the former may be a front main surface while the latter may be a rear main surface. The connection hole serves as a via-hole through which the buried conductors extend in order to electrically connect the wiring layer on the first main surface of the insulating base to other semiconductor devices mounted on the second main surface of the insulating base or terminals of another wiring substrate. In other words, the connection hole is preferable to electrically connecting a plurality of wiring substrates when three-dimensional mounting or the like is adopted. The connection hole may be formed either in the wiring region or the semiconductor element mounting region. The wiring layer constitutes a wiring, terminal and so on on the semiconductor element mounting region, and an electrode for electrical connection with a bonding pad, a package terminal and so on on the semiconductor element mounting region. The wiring substrate according to the second feature may be a printed circuit board, an integrated circuit board, a liquid quartz display substrate (e.g. a transparent glass substrate), a wiring substrate used for a semiconductor device of the MCM structure, a wiring substrate used for a semiconductor device of the CSP structure, or the like.

The wiring substrate may further comprise buried conductors which are provided in the connection hole without reaching the second main surface of the insulating base and are electrically connected to the one end of the wiring layer. The wiring layer of the wiring region can be thickened by the buried conductors, so that the wiring layer of the wiring region can be mechanically strengthened and protected against damages. Further, the wiring layer can be thinned because it is protected by the buried conductors, and be subject to minute patterning. Therefore, wirings and terminals can be minimized and increased in the number thereof, and the terminals can be arranged with reduced pitches therebetween. All of the foregoing are effective in downsizing the wiring substrate.

Still further, the connection hole can be used for aligning components for the three-dimensional mounting structure, i.e. components can be aligned without increasing the number of components and without using a complicated mounting structure. Alternatively, thin metallic films which are selectively formed on the rear surface of the wiring layer exposed in the connection hole may be used in place of the buried conductors.

With a third feature of the invention, there is provided a wiring substrate comprising: an insulating base having a wiring region and a semiconductor element mounting region; a buried conductor provided in the wiring region and extending between the first and second main surfaces of the insulating base; and a wiring layer having one end thereof electrically connected to the buried conductor on the first main surface of the insulating base and the other end thereof positioned on the semiconductor element mounting region. The wiring region and the semiconductor element mounting region are flush with each other and are at different positions as stated with respect to the second feature. The buried conductor may be arranged on either the wiring region or the semiconductor element mounting region. The buried conductor may be made of a cylindrical, rectangular, pentagonal or polygonal metal. As described with respect to the second feature, the wiring layer is used to form wirings, terminals and so on on the wiring region, and an electrode on the semiconductor element mounting region in order to electrically connect a bonding pad for a bare chip, a package terminal or the like.

The wiring substrate according to the third feature may be a printed circuit board, an integrated circuit board, a liquid quartz display substrate (e.g. a transparent glass substrate), a wiring substrate used for a semiconductor device of the MCM structure, a wiring substrate used for a semiconductor device of the CSP structure, or the like. The wiring layer of the wiring region can be reinforced by the buried conductors, so that the wiring layer can be mechanically strengthened and protected against damages. Further, the wiring layer can be thinned because it is protected by the buried conductors, and be subject to minute patterning. Therefore, wirings and terminals can be minimized and increased, and the terminals can be arranged with reduced pitches therebetween. All of these features are effective in downsizing the wiring substrate. In this case, the second main surface of the insulating base may be flush with the bottoms of the buried electrodes, or the bottoms of the buried electrodes may project compared with the second main surface of the insulating base.

In the wiring substrates with the second and third features, the electrode may be formed by thickening the wiring layer in the semiconductor element mounting region. In such a case, a bonding pad of a bare chip can be directly connected to the electrode in a face-down state (flip-chip), for example. In other words, the electrode of the wiring layer can be electrically connected to the bonding pad of the bare chip without passing via the front and side surfaces of the bare chip and second main surface of the wiring substrate, which enables a two-way connection in the size of the bare chip, and is effective in minimizing the wiring substrate.

According to a fourth feature, there is provided a semiconductor device comprising: a first insulating base having wiring regions and a semiconductor element mounting region; a first connection hole formed in the wiring region and extending between a first main surface and a second main surface of the first insulating base; a first wiring layer provided on the first main surface of the first insulating base, having one end thereof connected to the first connection hole and the other end thereof positioned in the semiconductor element mounting region; and a first semiconductor element positioned on the semiconductor element mounting region and connected to the first wiring layer. The term "semiconductor element" refers to at least a bare chip, a package including a bare chip, or the like. The first connection hole may be formed in the wiring region as described with respect to the second feature, or may be formed in the semiconductor element mounting region.

With the fourth feature, the wiring substrate is as effective as the wiring substrate with the second feature, can protect the wiring layer against damages. Further, it is possible to thin the wiring layer of the wiring region, to downsize the wirings and terminals, or increase the terminals. Further, a plurality of wiring substrate may be stacked and aligned without using a complicated structure. The wiring substrate can realize a semiconductor device suitable for the three-dimensional mounting.

In accordance with a fifth feature of the invention, there is provided a semiconductor device comprising: a first insulating base having wiring regions and a semiconductor element mounting region; a first buried conductor provided in the wiring region and extending between a first main surface and a second main surface of the first insulating base; a first wiring layer provided on the first main surface of the first insulating base, having one end thereof connected to the first connection hole and the other end thereof positioned in the semiconductor element mounting region; and a first semiconductor element connected to the first wiring layer at the semiconductor element mounting region. As described with respect to the fourth feature, the semiconductor element may be a bare chip, a package including a bare chip, or the like. The first buried conductor may be provided in the wiring region or in the semiconductor element mounting region as in the third feature.

In the semiconductor device with the fifth feature, the wiring substrate is as effective and advantageous as the wiring substrate according to the third feature. In the wiring substrate of the fifth feature, the wiring region is effectively protected against the breakdown, and has a reduced thickness. Further, it is possible to minimize and increase the terminals.

With the semiconductor devices having the fourth and fifth features, the thin wirings and terminals and thick electrodes are provided at the opposite ends of the wiring layer of the wiring substrate, respectively, so that the bonding pads of the semiconductor elements can be electrically connected to the electrodes of the wiring layer. These semiconductor devices are as advantageous and effective as those having the second and third features.

The semiconductor device of the fourth feature can comply with the three-dimensional mounting structure if it further includes inter-substrate connectors provided on the wiring region of the first wiring layer of the wiring substrate, a second insulating base having a second connection hole for embedding the inter-substrate connectors, a second wiring layer having one end thereof connected to the second connection hole and the other end thereof being present in a semiconductor element mounting region, and a second semiconductor element connected to the second wiring layer on the semiconductor element mounting region. Needless to say, the second connection hole may be formed in the wiring region or the semiconductor element mounting region. The inter-substrate connectors may be made of at least conductive bumps, solder balls, gold (Au) bumps, solder pastes, anisotropic conductive materials, and so on. In the semiconductor device of the fourth feature, a plurality of wiring substrates each of which has a semiconductor element may be stacked one over after another using buried conductors in the connection hole and the inter-substrate connectors. This is effective in improving the packaging density of components.

Further, the semiconductor device of the fifth feature can adopt the three-dimensional mounting structure if it further comprises inter-substrate connectors provided on wiring regions of a first wiring layer of the wiring substrate, a second buried conductor electrically connected to the inter-substrate connectors, a second insulating base for embedding the second buried conductor, a second wiring layer with one end thereof connected to the second connection hole on the first main surface of the second insulating base and the other end thereof being present in a semiconductor element mounting region, and a second semiconductor element connected to the second wiring layer on the semiconductor element mounting region. Needless to say, the second buried conductor may be formed in the wiring region or the semiconductor element mounting region.

In the foregoing description, only the two-layer structure is referred to for simplification. Needless to say, the semiconductor devices of the fourth and fifth features can have a three-layer, four-layer, or multiple layer structure. In other words, a plurality of wiring substrates can be stacked one over after another using inter-substrate connectors as desired, which improves the mounting density of components.

According to a sixth feature of the invention, there is a method of manufacturing a wiring substrate comprising: (1) forming a front conductive layer on a rear conductive layer; (2) selectively removing a part of the rear conductive layer and forming a buried conductor; (3) forming an insulating base in contact with the front conductive layer, the insulating base extending at least over the buried conductor; (4) selectively thinning a part of the buried conductor; (5) selectively thinning a part of the buried conductors; and (6) patterning the selectively thinned front conductive layer and forming a wiring and a terminal. In the foregoing method, the steps (4) and (5) may be carried out at the same time. In the step (2), the buried conductors are in the shape of a pillar or in the shape of a bump. As for the step (3), the insulating base may extend over a part or an entire part of the side wall of the buried conductors. Further, the insulating base may extend all over the buried conductors including the bottoms thereof.

If the steps (4) and (5) are simultaneously executed, it is possible to reduce the number of manufacturing processes. This is effective in improving the manufacturing yield, and reducing manufacturing cost, product cost and so on. Further, the insulating base covering the patterned buried conductors can be used as a mask for reducing a thickness of the buried conductors. This can obviate a process for forming a mask (e.g. a resist film formed on the second main surface of the wiring substrate), which means the reduction in the number of manufacturing processes.

Further, the step (1) preferably comprises forming an etching stop layer on a rear conductive layer, and forming a front conductive layer on the etching stop layer. The etching stop layer is made of a material having an etching rate which is lower than that of the rear conductive layer. Further, an etching rate of the front conductive layer is lower than that of the etching stop layer. For instance, when the etching stop layer is made of a nickel (Ni) film, and the rear and front conductive layers are made of thin copper (Cu) films or copper alloy films containing appropriate additives, it is possible to determine the etching rates as desired.

The rear and front conductive layers can have desired degrees of thickness and be independently patterned by inserting the etching stop layers between them. In order to minimize or increase terminals, the wiring layer is thinned while the buried conductors are thickened in order to reinforce the wiring layer. The use of the etching stop layers enables the rear conductive layers to be patterned as desired without adversely affecting the thickness of the front conductive layer.

BEST MODE FOR CARRYING OUT THE INVENTION

Figure 1:
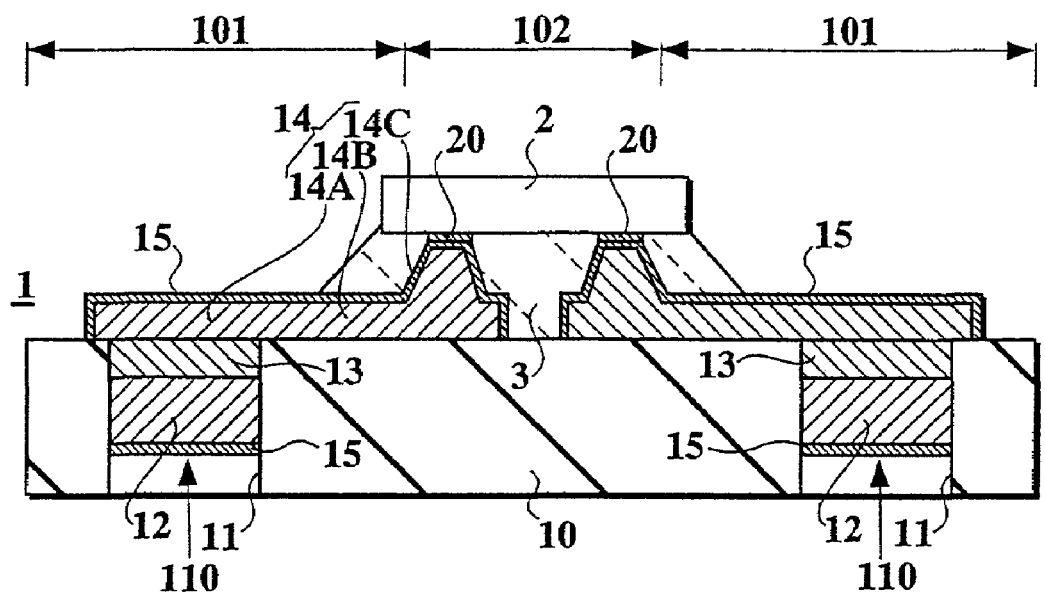
FIG. 1 schematically shows a wiring substrate and a semiconductor device constituted using the wiring substrate according to a first embodiment of the invention.

The invention will be described with references to first to fifth embodiments shown in the drawings. In the drawings, like or corresponding parts are denoted by like or corresponding reference numerals. It is to be noted that the drawings are schematic and that the relationship between thickness and dimensions, and ratios of thickness of respective layers may differ from actual sizes of components. Further, some drawings are depicted with different scales.

First Embodiment

[Structures of Wiring Substrate and Semiconductor Device]

Referring to FIG. 1, a semiconductor device of the first embodiment has the CSP structure in which a semiconductor element 2 is mounted on a wiring substrate 1.

Figure 2:
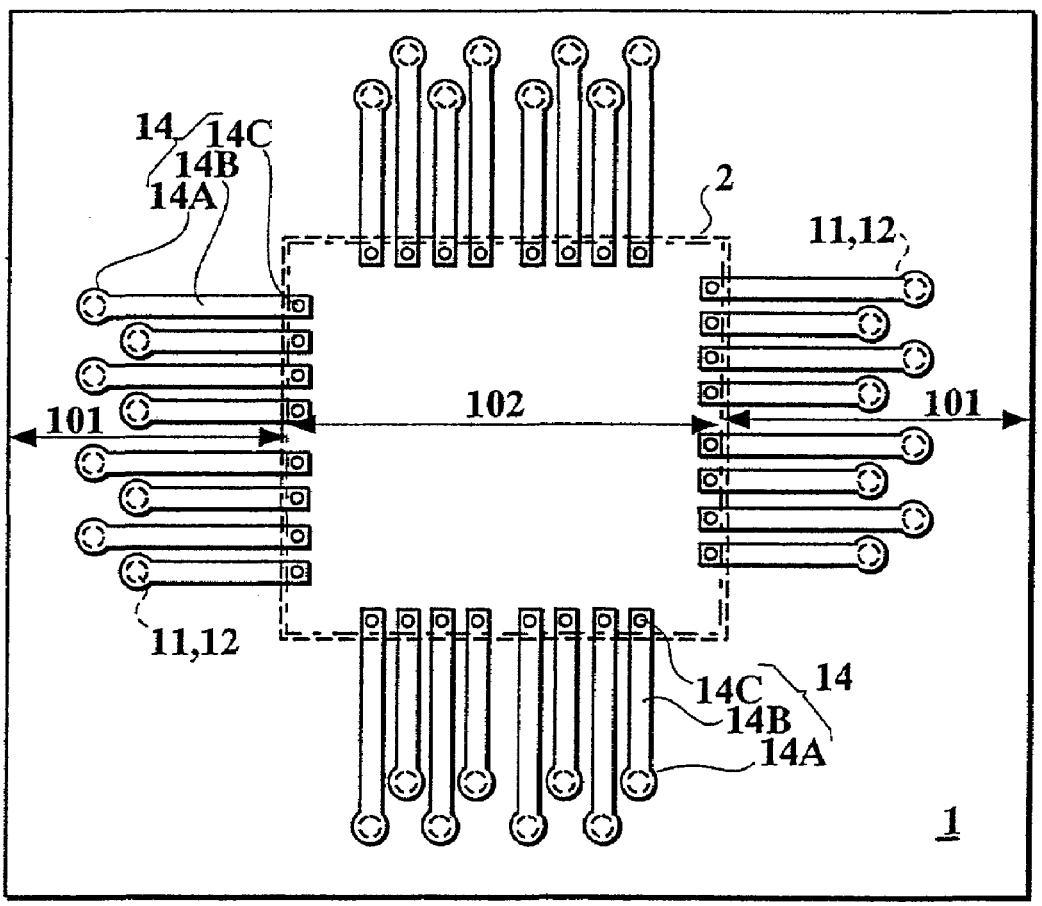
FIG. 2 is a top plan view of the wiring substrate and the semiconductor device.

The wiring substrate 1 comprises: an insulating base 10 having a wiring region 101 and a semiconductor element mounting region 102, and is provided on the wiring region 101 and having connection holes 11 extending between a first main surface (upper side in FIG. 1) and a second main surfaces (lower side in FIG. 1) of the insulating base 10; buried conductors 12 embedded in the connection holes 11 without reaching the second main surface of the insulating base 10; and a wiring layer 14 which has one end thereof electrically connected to the buried conductors 12 on the first main surface of the insulated substrate 10 and the other end thereof extending to the semiconductor element mounting region 102. As shown in FIG. 2, the wiring region 101 is flush with and surrounds the semiconductor element mounting region 102 which is at the center. In the first embodiment, the semiconductor element 2 is mounted on the semiconductor element mounting region 102, and is connected to the wiring layer 14.

The insulating base 10 is a basic insulating material of the wiring substrate 1, and has a shape basically similar to that of the semiconductor element 2 as shown in FIG. 2, although the insulating base 10 may have any shape. The insulating base 10 may be made of an insulating resin.

Figure 19:
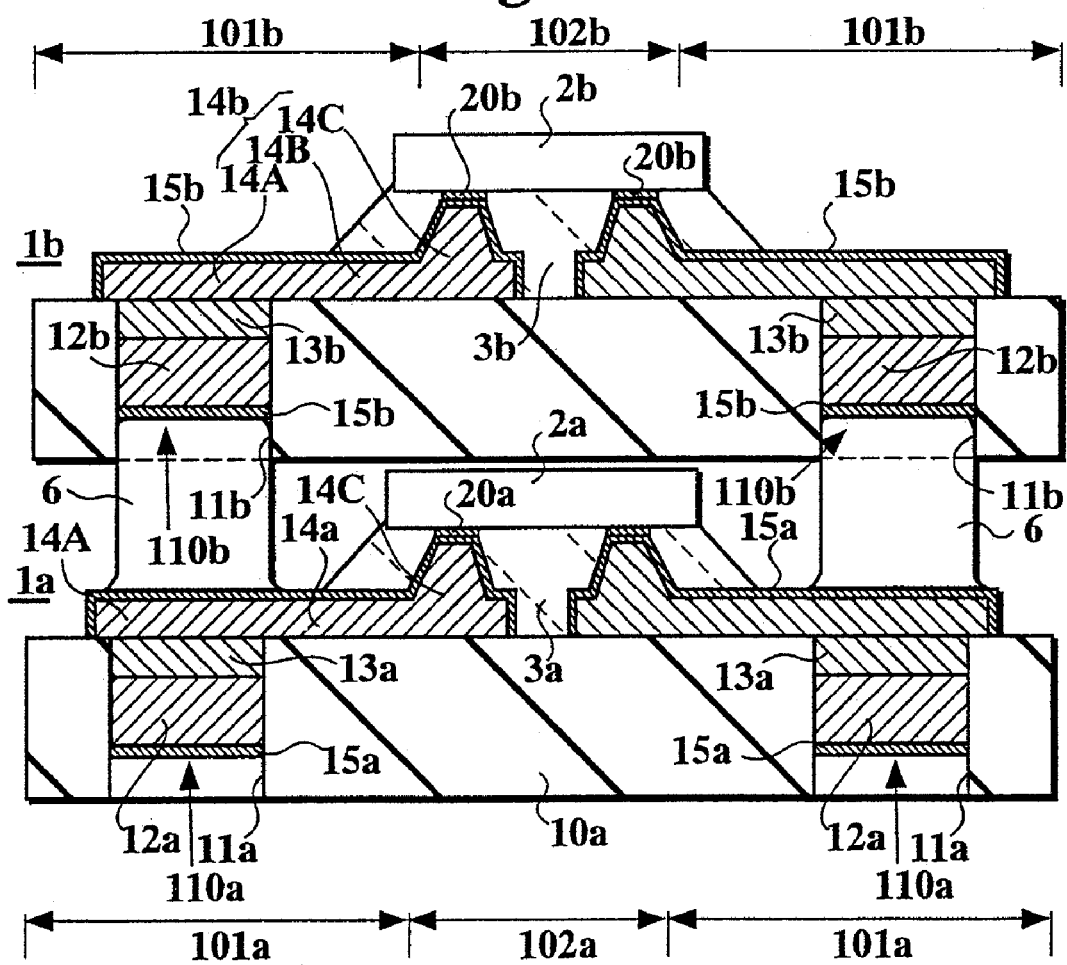
FIG. 19 is a schematic cross section of the semiconductor device of the three-dimensional mounting structure in the first embodiment.

The connection holes 11 are used at least in order to establish an electrical connection between the wiring layer 14 on the first main surface of the wiring substrate 1 and another device (e.g. another wiring substrate 1 as shown in FIG. 19). The connection holes 11 are circular, for example, but may be rectangular, pentagonal or polygonal. The buried conductors 12 are provided in the connection holes 11 without reaching the second main surface of the insulating base 10, so that recesses 110 (aligning parts) are defined by inner walls of the connection holes 11 and by raised first main surfaces of the buried conductors 12. The recesses 110 are used for aligning the wiring substrate 1 (e.g. a first wiring substrate 1a) and another wiring substrate 1 (e.g. a second wiring substrate 1b) when a plurality of wiring substrates are stacked one over after another (refer to FIG. 19).

The buried conductors 12 function not only as electrodes (terminals) for electrically connecting to another wiring substrate on the second main surface of the wiring substrate 1 but also as through-hole wirings or via-hole wirings for electrically connecting the wiring layer 14 of the wiring substrate 1 and another wiring substrate 1. Further, the buried conductors 12 thicken the wiring layer 14 (especially a terminal 14A) on the first main surface of the wiring substrate 1, mechanically reinforce the wiring layer 14, and form the aligning recesses 110 for stacking a plurality of the wiring substrates 1. Fundamentally, the buried conductors 12 may be preferably thinner than the insulating base 10, and thicker than the wiring layer 14 in order to improve the mechanical strength thereof. The buried conductors 12 are preferably made of conductive copper (Cu) films or conductive copper alloy films containing some additives. For instance, such films are 50 µm to 60 µm thick, or preferably 55 µm thick.

The wiring layer 14 has the thin terminal 14A at its one end, a thick bump electrode 14C at the other end thereof, and a wiring 14B positioned between the thin terminal 14A and the bump electrode 14C. The terminal 14A, wiring 14B and electrode 14C are structured as one member, and are made of a conductive material. The terminal 14A and wiring 14B are positioned at the wiring region 101 which extends to the semiconductor element mounting region 102. The electrode 14C is at the semiconductor element mounting region 102. The terminal 14A is electrically connected to the buried conductors 12. The wiring 14B electrically connects the terminal 14A and the electrode 14C. Further, the electrode 14C is electrically connected to bonding pads 20 on a semiconductor element mounting surface (at a lower part in FIG. 1) of the semiconductor element 2 (semiconductor chip).

The semiconductor element 2 is a semiconductor chip in which active and passive elements and so on are integrated on a front surface of a single quartz silicon substrate (single quartz silicon chip). Further, the semiconductor element 2 is a bare chip, and is not encapsulated by a resin mold or the like as shown in FIG. 1. A plurality of bonding pads 20 are provided on the semiconductor element 2, and are used in order to electrically connect between an integrated circuit including active and passive elements, and the electrode 14C of the wiring layer 14.

Specifically, the bonding pads 20 are connected to a plurality of high impurity density regions (i.e. source/drain regions or emitter/collector regions) where donors or acceptors of approximately $1 \times 10^{18}$ cm$^{-3}$ to $1 \times 10^{21}$ cm$^{-3}$ are doped on the element forming surface of the semiconductor element 2. A plurality of electrode layers made of metal such as aluminum (Al), an aluminum alloy (Al—Si, Al—Cu, Al—Cu—Si) or the like are formed in order to come into ohmic contact with the high impurity density regions. On the electrode layers is provided a passivation film made of an oxide film (SiO$_2$), a PSG film, a BPSG film, a nitride film (Si$_3$N$_4$), a polyimide film or the like. A plurality of windows are formed in a part of the passivation film in order to expose the electrode layers, thereby forming the bonding pads 20. Alternatively, the bonding pads 20 may be formed as other metallic patterns connected to the electrode layers and the metal wirings. In the case of a MOSFET or the like, a plurality of bonding pads 20 made of aluminum (Al), an aluminum alloy (Al—Si, Al—Cu, Al—Cu—Si) or the like connected to a poly-silicon gate electrode. Still alternatively, additional bonding pads 20 may be provided via a plurality of signal wires such as gate wirings connected to a plurality of poly-silicon gate electrodes. Gate electrodes made of refractory metals such as tungsten (W), titan (Ti), molybdenum (Mo) or the like, refractory metal silicide (WSi$_2$, TiSi$_2$, MoSi$_2$) or the like, or polycide or the like may be used in place of the poly-silicon gate electrodes.

As shown in FIG. 1, the semiconductor element 2 is mounted on the wiring substrate 1 with the front side, where the integrated circuit is provided, facing down (flip chip). In the case of the flip chip structure, the bonding pads 20 are not always required to be arranged around the semiconductor element 2. The wiring layers 14 are made of conductive materials such as copper films similarly to the buried conductors 12, and are 30 µm to 40 µm thick, preferably 35 µm thick at the electrode 14C.

Each electrode 14C is narrower than each striped wiring 14B. The wiring substrate 1 is effective in arranging a great number of bonding pads 20 of the semiconductor element 2 in the shape of an area array with reduced pitches between the terminals.

An etching stop layer 13 is provided in the connection hole 11 between the buried conductors 12 and the terminal 14A of the wiring layer 14. The etching stop layer 13 is conductive and has an etching rate which is different from an etching rate of the buried conductors 12 (and the wiring layer 14), and is made of a thin nickel (Ni) film with a thickness of 0.1 µm to 0.3 µm, preferably 0.2 µm.

An anisotropic conductive material 3 is used in order to mount the semiconductor element 2. Specifically, the anisotropic conductive material 3 can stick the semiconductor element 2 with a plurality of bonding pads 20 and the electrode 14C kept conductive but with the other parts insulated, and is made of an insulated resin such as an urethane or epoxy resin which is mixed with a gold (Au) powder, a silver (Ag) powder, a nickel (Ni) powder, a titan-nickel alloy (Ti—Ni) powder, or the like. The anisotropic conductive material 3 conducts electricity only to the area where stress is applied, so that the electrode 14C and its periphery are made conductive.

As described above, the terminal 14A at the wiring region 101 of the wiring layer 14 is reinforced by the buried conductor 12 embedded in the connection hole 11 (i.e. the thickness of the terminal 14A is increased), which is effective in improving the mechanical strength of the terminal 14A, in protecting the terminal 14A against break-down, and against break-down between the terminal 14A and inter-substrate connector 6 (shown in FIG. 19). Further, reinforced by the buried conductor 12, the terminal 14A and wiring 14B can be thinned at the wiring region 101 of the wiring layer 14. This can minimize the terminal 14A and the wiring 14B, or increase the number of terminals 14A.

Further, the wiring substrate 1 can be minimized since the thin terminal 14A and wiring 14B are provided at one end of the wiring layer 14 (i.e. at the wiring region 101), and a pitch between the terminals 14A and between the wirings 14B can be reduced. Still further, the thick electrode 14C is provided at the other part of the wiring layer 14 (i.e. at the semiconductor element mounting region 102), which enables the electrode 14C to be directly connected to the bonding pads 20 of the semiconductor element 2 in a face-down state. In other words, the terminal 14C and bonding pads 20 can be connected without passing over the front, side and rear surfaces of the semiconductor element 2, and they can be mutually connected on the semiconductor element 2. This is effective in minimizing the wiring substrate 1.

Still further, it is possible to protect the terminal 14A at the wiring region 101 of the wiring layer 14 against break-down. The wiring region 101 is thinned in order to minimize the terminal 14A and wiring 14B or increase the number of terminals 14A. The aligning part 110 can be made without complicating the structure of the wiring substrate 1. As a result, the semiconductor device becomes suitable to the three-dimensional mounting structure as shown in FIG. 19, which shows that a plurality of semiconductor devices of FIG. 1 are stacked one over after another using inter-substrate connectors 6.

Referring to FIG. 19, a lower first wiring substrate 1a comprises: a first insulating base 10a having a wiring region 101a and a semiconductor element mounting region 102a, and having a first connection hole 11a in the wiring region 101a, the first connection hole 11a extending between first and second main surfaces of the insulating base 10a; a first buried conductor 12a embedded in the first connection hole 11a; and a first wiring layer 14a having one end thereof electrically connected to the first buried conductor 12a on the first main surface of the first insulating base 10 and the other end thereof extending to the semiconductor element mounting region 102a. A bonding pad 20a of the first semiconductor element 2a is connected to a terminal 14C of the first wiring layer 14a at the semiconductor element mounting region 102a.

The inter-substrate connector 6 is provided at the wiring region 101a of the first wiring substrate 1a, and is electrically connected to a second buried conductor 12b of a second wiring substrate 1b. The inter-substrate connector 6 is preferably made of solder balls, gold (Au) bumps, silver (Ag) bumps, copper (Cu) bumps, nickel-gold alloy (Ni—Au) bumps, nickel-gold-indium alloy (Ni—Au—In) bumps or the like. The solder balls are preferably eutectic solder balls made of tin (Sn) and lead (Pb) in the ratio of 6:4 and having a diameter of 100 µm to 250 µm and a height of 50 µm to 200 µm. Alternatively, the solder balls may be made of Sn and Pb in the ratio of 5:95, and so on.

The upper second wiring substrate 1b is identical to the lower first wiring substrate 1a, and comprises a second wiring region 101b and a semiconductor element mounting region 102b. A second connection hole 11b is formed at the wiring region 101b of a second insulating base 10b, and extends between first and second main surfaces of the second wiring substrate 1b. The second buried conductor 12b is embedded in the second connection hole 11b. A space near the bottom of the second connection hole 11b serves as an aligning part 110b, into which the inter-substrate connector 6 is fitted, so that the first and second wiring substrates 1a and 1b can be automatically aligned. The second buried conductor 12b has its one end connected to the second wiring layer 14b on the first main surface of the second wiring substrate 10b, and the other end thereof extending to the semiconductor element mounting region 102b. A bonding pad 20b of the second semiconductor element 2b is connected, on the semiconductor element mounting region 102b, to an electrode 14C of the second wiring layer 14b.

The first and second semiconductor elements 2a and 2b are attached by anisotropic conductive members 3a and 3b which enable electric connections between bonding pads 20a and 20b, and first and second wiring layers 14a and 14b, respectively.

FIG. 19 shows that the first and second wiring substrates 1a and 1b are stacked. Alternatively, a plurality of wiring substrates such as third, fourth, . . . wiring substrates, may be stacked one over after another, thereby accomplishing the three-dimensional structure. According to the first embodiment, the first, second, third, . . . wiring substrates 2a, 2b, . . . may be stacked one over after another using inter-substrate connectors 6, thereby accomplishing the three-dimensional structure suitable to high density mounting. Further, as shown in FIG. 19, the aligning part 110 (110b) necessary for the three-dimensional structure may be recess-shaped by arranging the buried conductor 12 (12b) only on the peripheral surface of the connection hole 11 and by preparing a space on the second main surface of the wiring substrate. Therefore, it is possible to form the aligning part 110 (110b) without increasing the number of components and without using a complicated structure.

[Method of Manufacturing Wiring Substrates]

The wiring substrate 1 is manufactured as described hereinafter with reference to FIG. 3 to FIG. 15.

Figure 3:
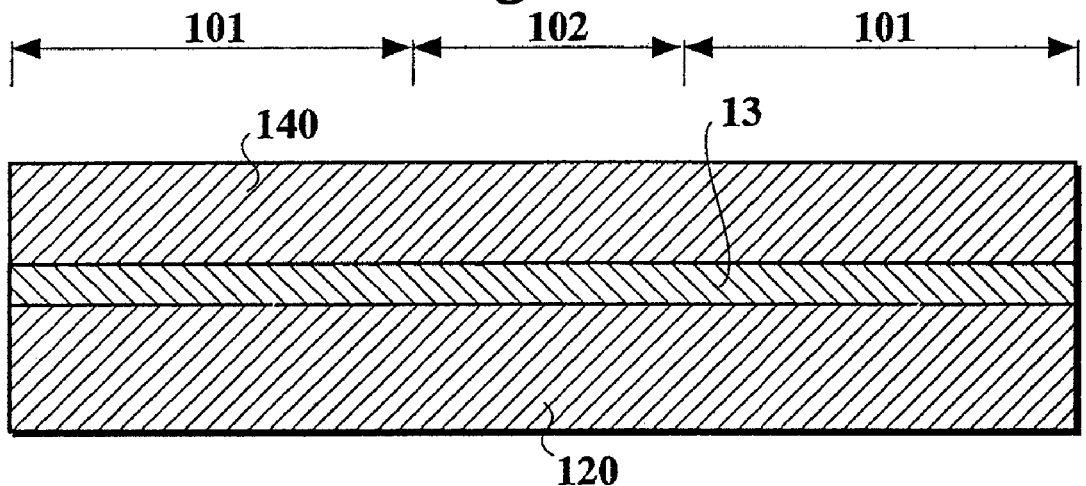
FIG. 3 is a cross section showing how the wiring substrate is formed.
Figure 4:
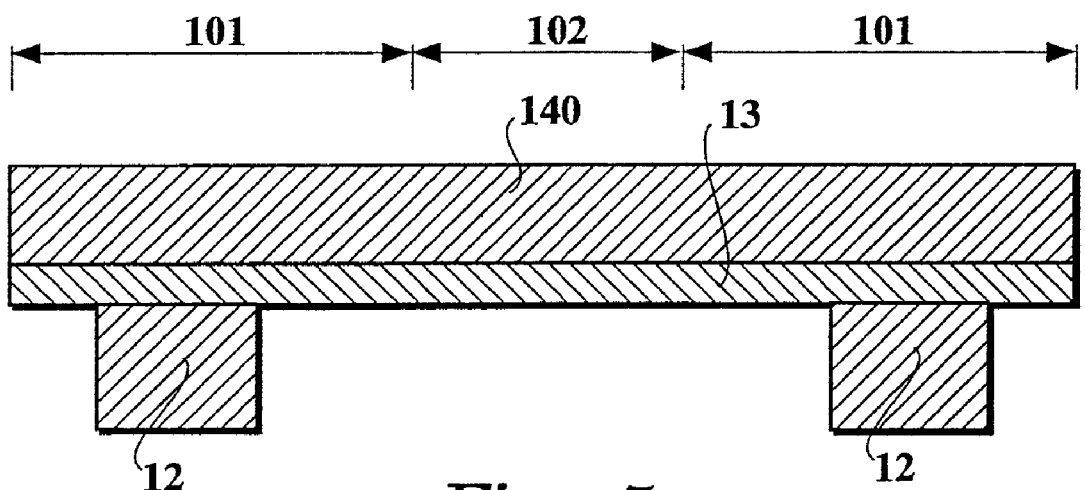
FIG. 4 is the continuation of FIG. 3.

(1) As shown in FIG. 3, a front conductive layer 140 is formed on a rear conductive layer 120 with an etching stop layer 13 extending over the wiring regions 101 and the semiconductor element mounting region 102, i.e. three metal layers are formed. The rear conductive layer 120 is used for making the buried conductors 12, and is preferably made of a thin copper film which is approximately 50 µm to 80 µm, preferably 65 µm, thick, for example. The front conductive layer 140 is used to form the wiring layer 14, i.e. the terminal 14A, wiring 14B and electrode 14C, and is made of a thin copper film of which thickness is 30 µm to 40 µm, preferably 35 µm. The etching stop layer 13 is preferably made of a thin nickel (Ni) film whose thickness is 0.1 µm to 0.3 µm, preferably 0.2 µm.

(2) A resist film is coated over the rear conductive layer 120 (lower surface thereof shown in FIG. 3), and is exposed and developed, thereby forming an etching mask (not shown). If made of a positive resist film, the etching mask extends only over an area where the connection hole 11 is to be formed on the wiring region 101 of the rear conductive layer 120. The etching mask is used to remove the rear conductive layer 120 by etching, and a plurality of buried conductors (bump electrodes) 12 are made using a remaining part of the rear conductive layer 120 at the wiring region 101 shown in FIG. 4. When forming the buried conductors 12, the etching stop layer 13 controls a degree of etching on the semiconductor element mounting region 102 on the rear conductive layer 120, so that the semiconductor element mounting region 102 can be reliably removed at a border with the etching stop layer 13. The etching mask (the resist film) is scraped after the formation of the buried conductors 12.

Figure 5:
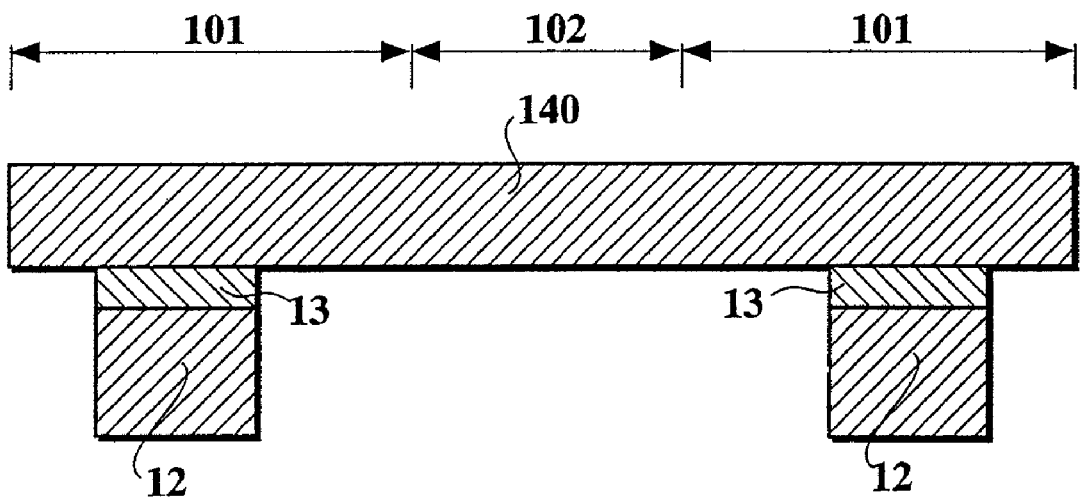
FIG. 5 is the continuation of FIG. 4.

(3) In the semiconductor element mounting region 102, the etching stop layer 13 is etched and removed using the buried conductors 12 as etching masks as shown in FIG. 5. The etching stop layer 13 has an etching rate different from that of the front conductive layer 140, and can be selectively removed without over-etching the front conductive layer 140. Thereafter, the front conductive layer 140 is roughened using an agent CPE-900 produced by Mitsubish Gas Chemical, Co. Ltd., for example.

Figure 6:
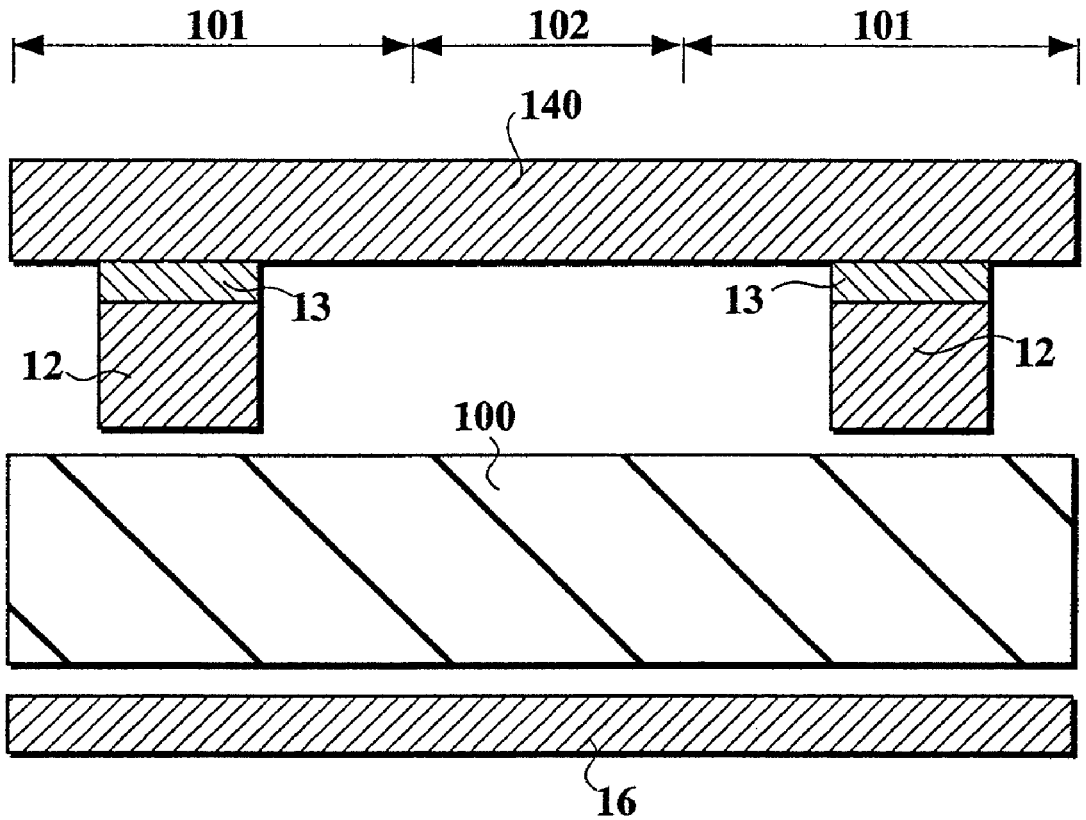
FIG. 6 is the continuation of FIG. 5.
Figure 7:
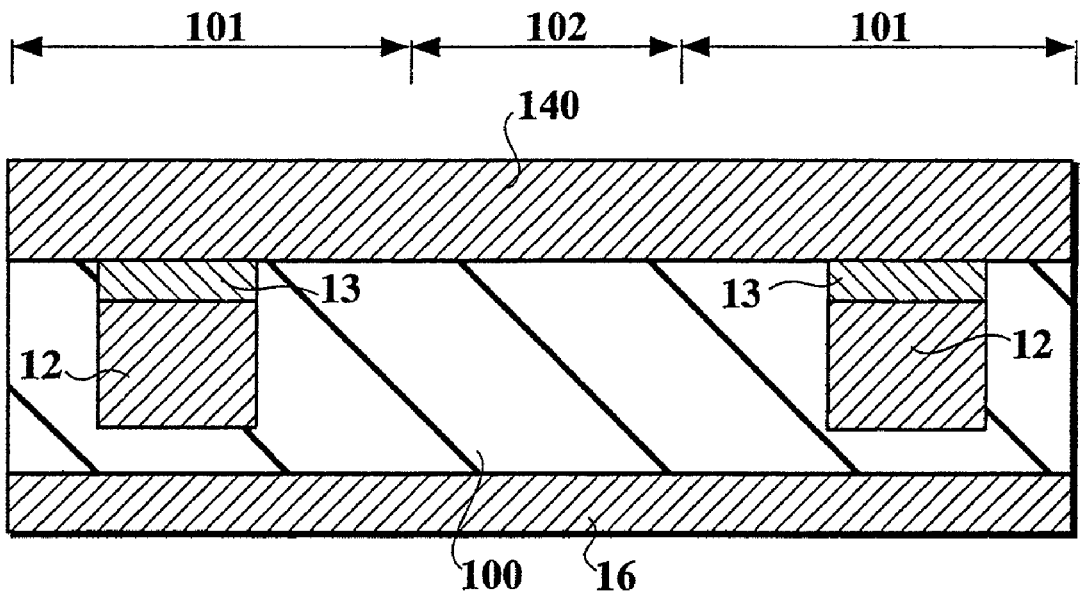
FIG. 7 is the continuation of FIG. 6.

(4) Referring to FIG. 6, an insulating base 100 and a flattening member 16 are prepared near the buried conductors 12, and extend over the wiring region 101 and the semiconductor element mounting region 102. The insulating base 100 may be an insulated resin such as E679-P manufactured by Hitachi Chemical Co., Ltd. which is non-woven glass filler cloth impregnated with epoxy resin, for example. The insulating base 100 is thicker than the buried conductors 12, and is approximately 51 µm to 130 µm thick, for example. Specifically, the thickness of the insulating base 100 is determined so that a distance from the bottom of the buried conductors 20 to the second main surface of the insulating base 100 is preferably between 1 µm or and 50 µm. The flattening member 16 is preferably copper foil having a thickness of 18 µm, for example, which is not roughened but has a smooth shiny surface, and is in contact with the insulating base 100.

(5) The insulating base 100 is sandwiched between the buried conductors 12 and the flattening member 16. Then, pressure is applied to the insulating base 100 via the flattening member 16. The insulating base 100 is pushed toward the buried conductors 12, and can remain flat on its surface (lower side in FIG. 7). Further, a part of the insulating base 100 is pushed around the buried conductors 12, and surrounds them.

The insulating base 100 in contact with the shiny surface of the flattening member 16 can be smoothly pushed around the buried conductors 12.

Figure 8:
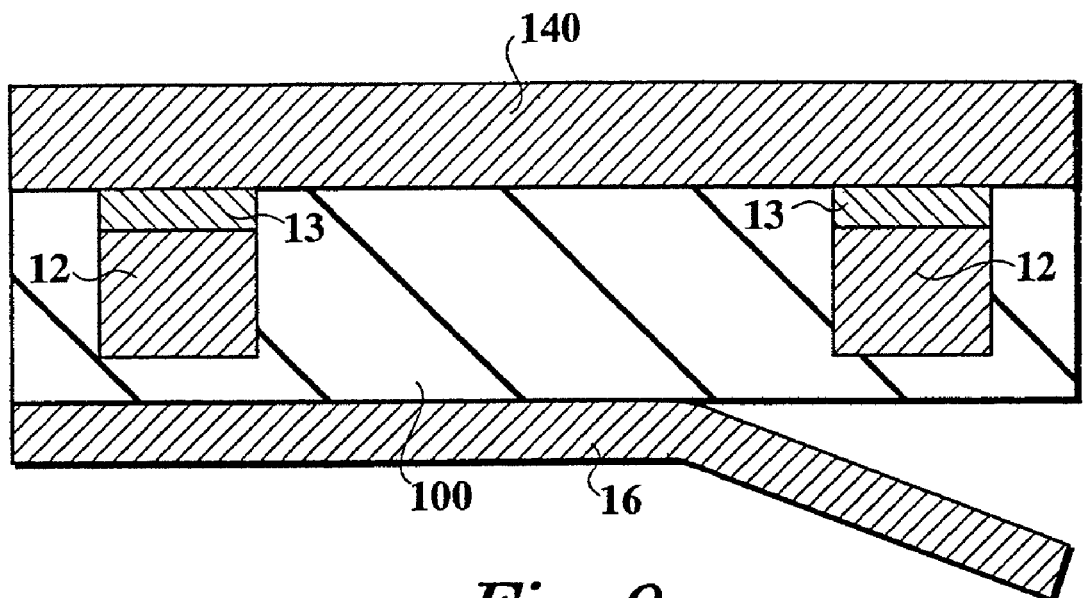
FIG. 8 is the continuation of FIG. 7.
Figure 9:
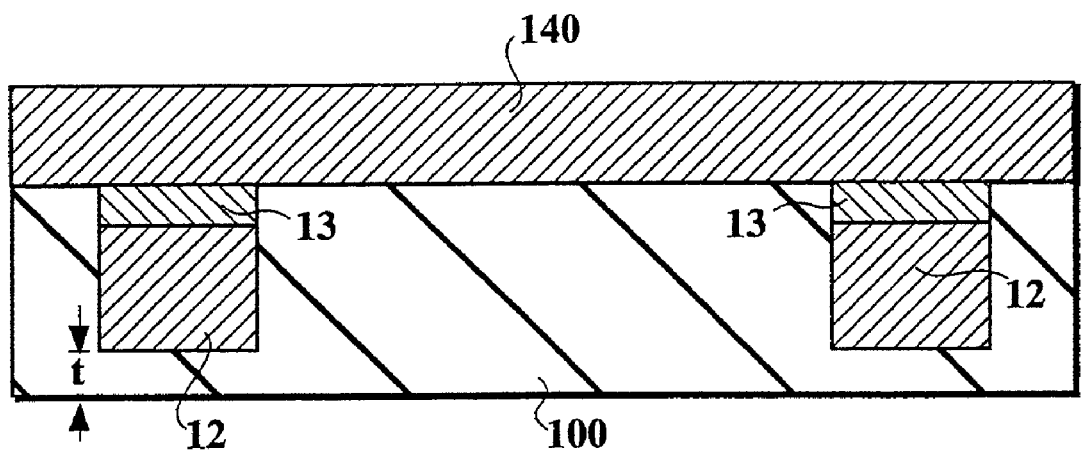
FIG. 9 is the continuation of FIG. 8.

(6) Thereafter, the flattening member 16 has its shiny surface easily peeled off from the insulating base 100 as shown in FIG. 8. FIG. 9 shows the insulating base 100 without the flattening member 16. In other words, the insulating base 100 has the first main surface in contact with the rear surface of the front conductive layer 140 and the second main surface opposite to the first main surface, and is in contact with the bottoms of the buried conductors 12. Therefore, a distance t from the bottom of the buried conductors 12 to the second main surface of the insulating base 100 is between 1 μm and 50 μm, which facilitates a polishing process to be described hereinafter.

Figure 10:
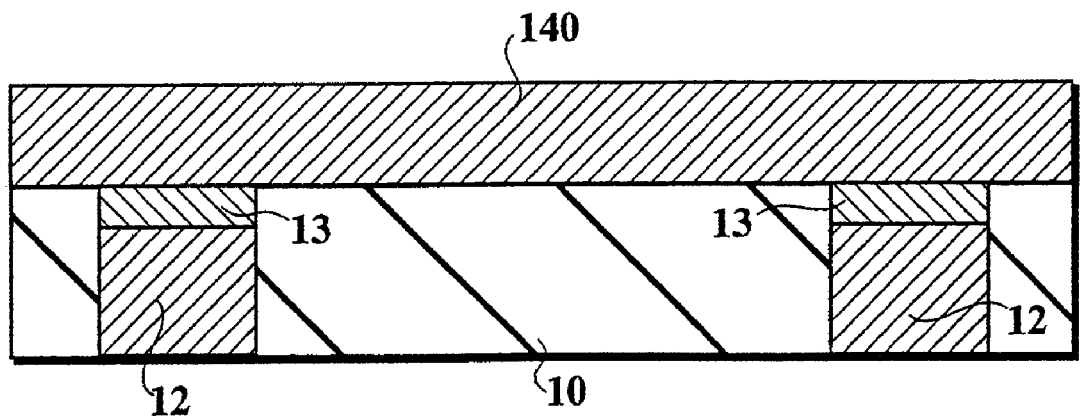
FIG. 10 is the continuation of FIG. 9.

(7) The insulating base 100 is polished until the surfaces of the buried conductors 12 are exposed as shown in FIG. 10. Further, the insulated resin and filler are removed from the insulating base 100. An insulating base 100 is formed on the front conductive layer 140 using the polished insulating base 100, and extends over the buried conductors 12. The insulating base 100 is polished as follows. First of all, an adhesive which melts and hardens at a low temperature is applied onto the front conductive layer 140. The front conductive layer 140 is fixedly attached on a level block via the surface where the adhesive is hardened. A predetermined amount of abrasives is applied onto a rotary disc which is substantially parallel to the level block. The level block is then lowered toward the rotary disc, which is the rotated while load of 14.7 kPa is being applied thereto for approximately 15 minutes. By this polishing process, the bottoms of the buried conductors 12 can be exposed from the insulating base 10.

Figure 11:
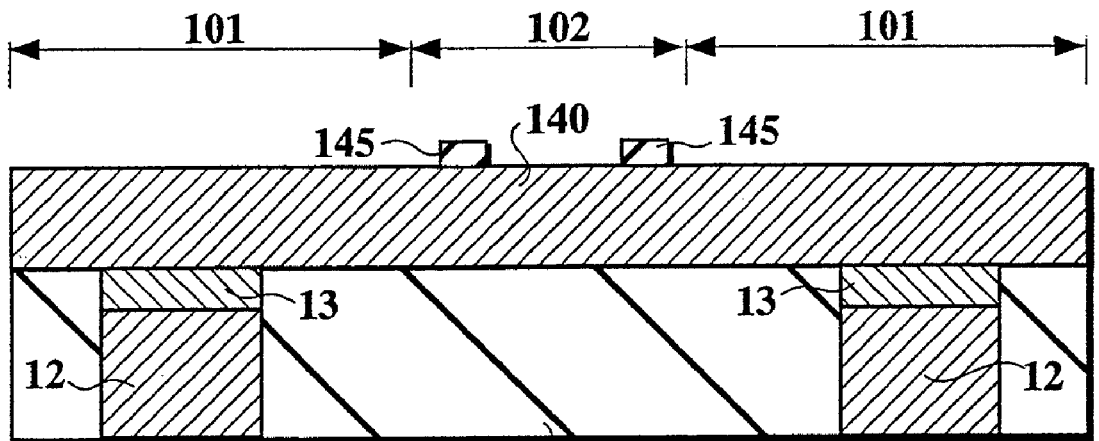
FIG. 11 is the continuation of FIG. 10.

(8) Thereafter, a resist film is laminated on the front conductive layer 140 (shown in FIG. 11), and is exposed and developed, so that etching masks 145 are formed as shown in FIG. 11. The etching masks 145 cover the front conductive layer 140 only at areas where electrodes 14C of the semiconductor element mounting region 102 are to be made, and do not extend over the other parts of the front conductive layer 140. The resist film may be made of RESIST Hi-RC manufactured by Hitachi Chemical Co. Ltd., RESIST 401y25 manufactured by Nippon Synthetic Chemical Co., Ltd., or the like. When 401y25 is used, the resist film is laminated on the front conductive layer 140 at a roll temperature of 110° C. and a rolling speed of 0.6 m/min. Further, the resist film is exposed by a total exposure energy of approximately 80 mJ/cm$^2$, so that images of the electrodes 14C are printed on the front conductive layer 140. Then, the front conductive layer 140 is developed using a sodium carbonate solution or a tetra methyl ammonium hydroxide solution. After the development, the etching masks 145 are exposed by an energy of 100 mJ/cm$^2$ to 300 mJ/cm$^2$ in order to promote adhesion thereof.

Figure 12:
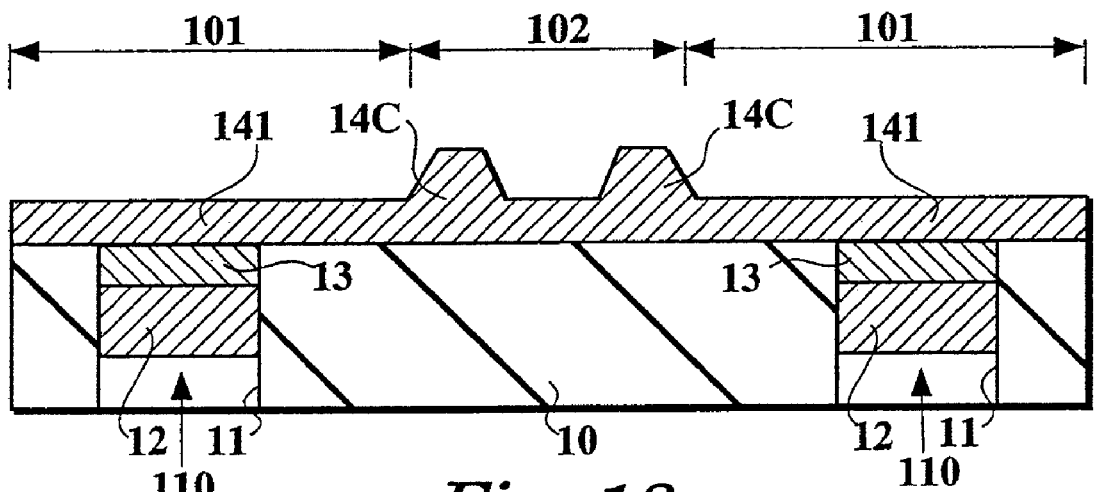
FIG. 12 is the continuation of FIG. 11.

(9) The front conductive layer 140 is half-etched using the etching mask 145 in order to selectively thin the wiring region 101. As shown in FIG. 12, a selectively thinned front conductive layer 141 is obtained, and thick electrodes 14C are formed at the positions which are covered by the etching mask 145. In other words, the electrodes 14C are as thick as the front conductive layer 140, e.g. 35 μm thick, and the thinned front conductive layer 141 is approximately 10 μm to 15 μm thick. No etching mask is present on the rear surfaces (bottoms) of the buried conductors 12, i.e. the bottoms of the buried conductors 12 are exposed on the insulating base 10. The buried conductors 12 are etched using the insulating base 10 as an etching mask, so that they are partially thinned. Therefore, the bottoms of the buried conductors 12 are raised in the connection holes 11, so that aligning recesses 110 are defined by the inner wall of the connection holes 11 and the bottoms of the buried conductors 12. The half-etching is performed using a solution whose main components are sulfuric acid and hydrogen peroxide, e.g. chemical polishing solutions SE-07, CPE-750, CPS, or a mixture of these solutions which are produced by Mitsubishi Gas Chemical Co., Ltd. In the etching solutions, a density of hydrogen peroxide is 2.0 g/100 ml to 10.0 g/100 ml, and a density of copper is 3.0 g/100 ml to 10.0 g/100 ml. The half-etching is carried out by showering the etching solution of 20° C. to 30° C. and by using a conveyer etching system. The etching mask 145 is removed by a sodium or potassium hydroxide solution.

Figure 13:
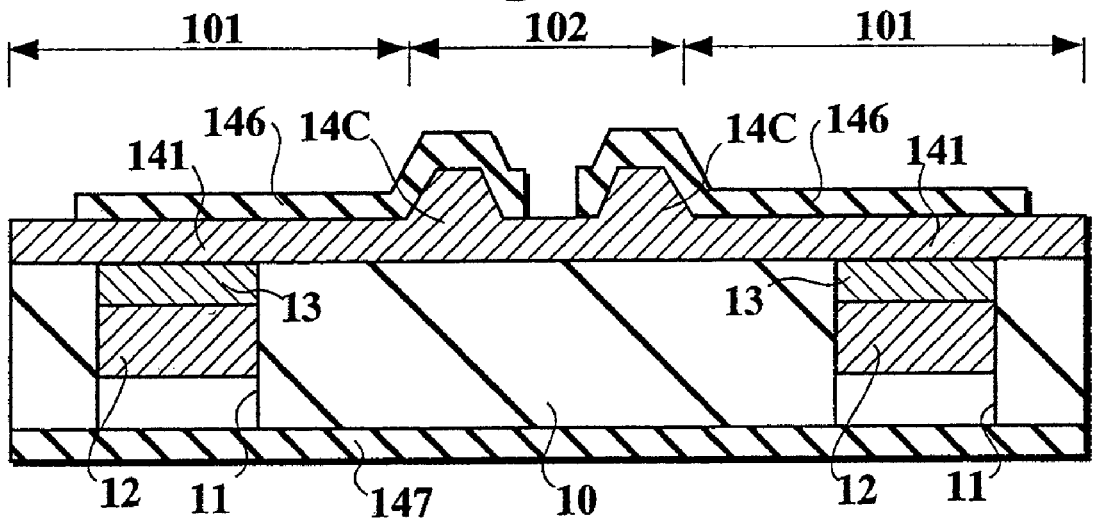
FIG. 13 is the continuation of FIG. 12.

(10) Thereafter, the resist films are laminated on the front of the front conductive layer 141 and the rear surface of the insulating base 10 (the upper and lower surfaces shown in FIG. 13). The resist films may be laminated simultaneously or at different times. The resist film on the front surface of the front conductive layer 141 is exposed and developed using a prepared mask. Etching masks 146 are formed using front resist masks as shown in FIG. 13. The etching masks 146 are particularly patterned in order to extend only over the terminals 14A, striped wirings 14B, and electrodes 14C which are positioned on the wiring region 101 of the front conductive layer 141. The resist film laminated on the bottom is also exposed and developed, thereby forming an etching mask 147 extending all over the rear surface of the insulating base 10. The resist film may be made of RESIST Hi-RC manufactured by Hitachi Chemical Co., Ltd., RESIST 401y25 manufactured by Nippon Synthetic Chemical Co., Ltd., or the like. The resist film is laminated at a roll temperature of 110° C., and at a speed of 0.3 m/min, which is lower than the laminating speed of the resist films 145 used to form the electrodes 14C. Further, the resist film can reduce foams which are attracted to a border between the thin front conductive layer 141 and the thick electrodes 14C. The resist films are exposed using a total exposure energy of approximately 80 mJ/cm$^2$ in order to print patterns of the terminals 14A, wirings 14B and electrodes 14C, and are developed using the sodium carbonate solution or the tetra-methyl ammonium hydroxide solution.

Figure 14:
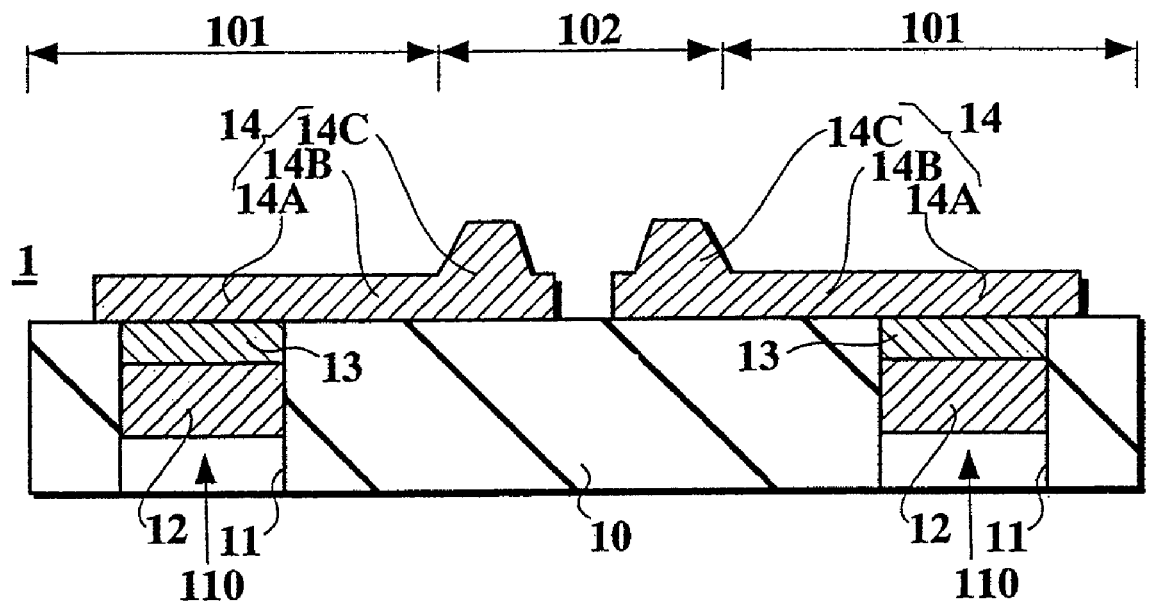
FIG. 14 is the continuation of FIG. 13.
Figure 15:
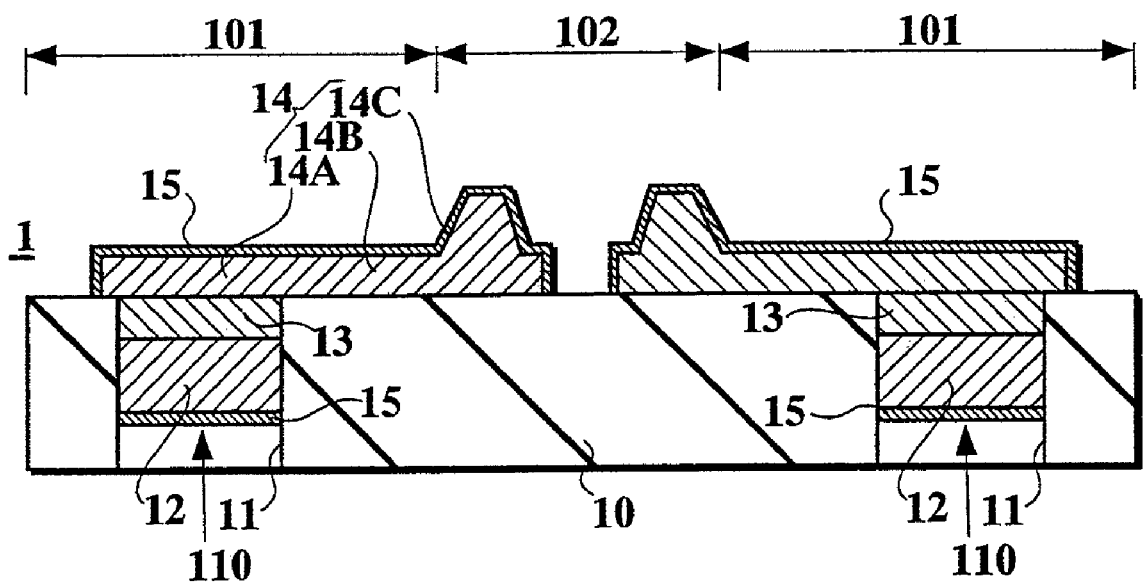
FIG. 15 is the continuation of FIG. 14.
Figure 16:
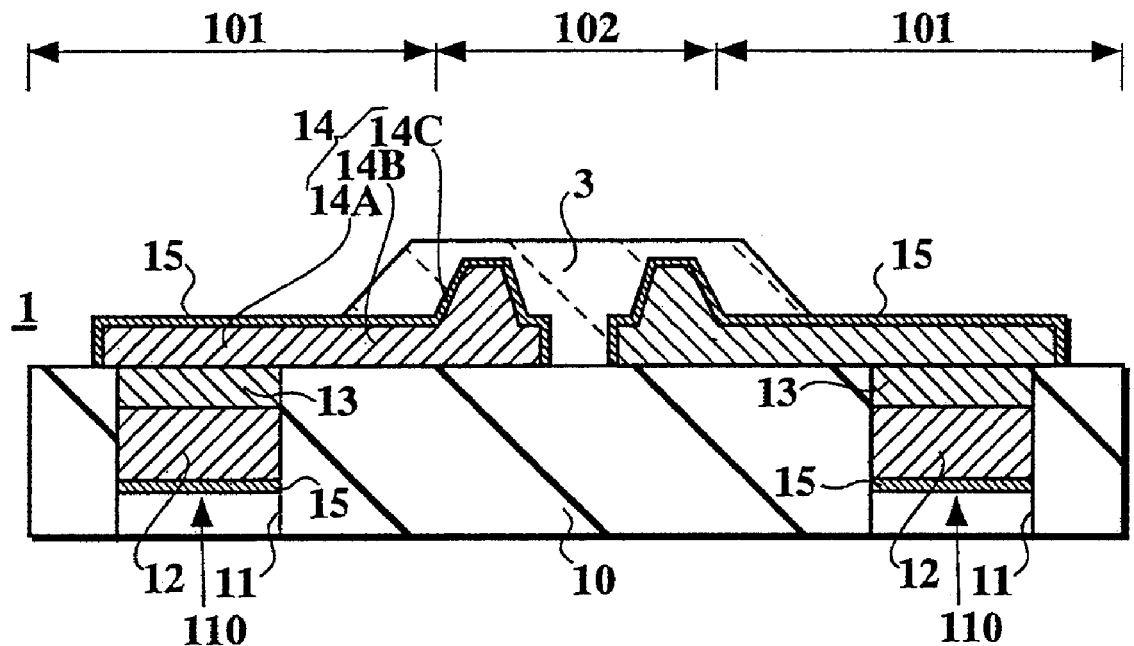
FIG. 16 is a cross section showing how the semiconductor device is formed in the first embodiment.
Figure 17:
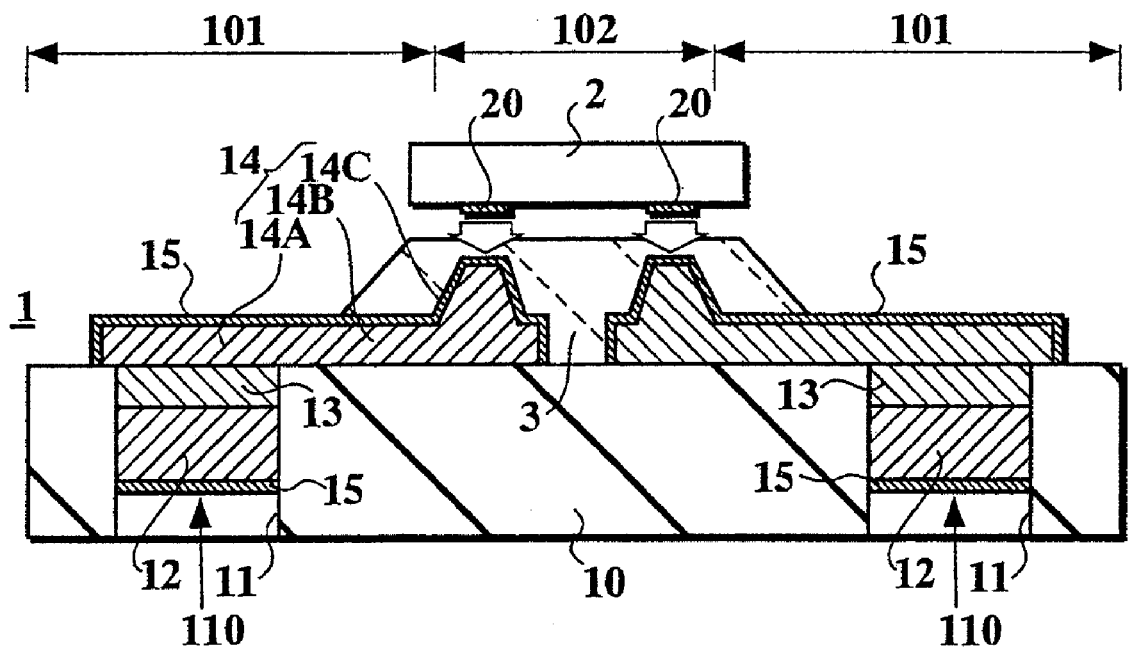
FIG. 17 is the continuation of FIG. 16.

(11) The front conductive layer 141 is selectively etched using the etching masks 146 and 147. As a result, the front conductive layer 141 not covered by the etching masks is removed, so that a plurality of terminals 14A, striped wirings 14B are formed as shown in FIG. 14. The terminals 14A, wirings 14B and electrodes 14C are shaped as shown in FIG. 2. This etching is performed using an etching solution mainly containing ferric chloride and copper (II) chloride, or an alkali etching solution such as A PROCESS SOLUTION manufactured by Mel Strip Co., Ltd.

(12) The etching masks 146 and 147 are then removed using a sodium or potassium hydroxide solution. Thereafter, a solder-resist film is preferably formed on the exposed part of the insulating base 10 except for the buried conductors 12 and the wiring layer 14. The solder-resist film prevents the wirings 14B of the wiring layer 14 from break-down, and reduces an area to be plated if plating is performed in a post-treatment process. The solder-resist film may be made of RESIST FC HARD manufactured by Shikoku Chemical Co., Ltd., is applied by a screen printing process and is then cured by heat (no solder-resist film is formed on the wiring substrate 1 of the first embodiment).

(13) Plated layers are formed on the buried conductors 12, terminals 14A, wirings 14B and electrodes 14C of the wiring layer 14. The plated layers are made of nickel (Ni), gold (Au) and so on, and are formed by non-electrolytic or electrolytic plating.

The wiring substrate 1 is completed by the foregoing steps.

In the foregoing method, the following steps can be simultaneously carried out: selectively thinning parts of the buried conductors 12; partially thinning the wiring region 101 of the front conductive layer 140 and forming the terminals 14A and wirings 14B; and forming the electrodes 14C on the semiconductor element mounting region 102 of the front conductive layer 140 (i.e. forming the wiring layer 14 provided with the terminals 14A and wirings 14B). Therefore, it is possible to reduce the number of steps for manufacturing the wiring substrate 1, which is effective in improving the manufacturing yield, and reducing manufacturing and product costs of the wiring substrate. Further, the buried conductors 12 can be partially thinned using the insulating base 1 as a mask without making a particular mask, so that it is possible to reduce the number of manufacturing steps for the wiring substrate 1.

In the foregoing manufacturing method, the etching stop layer 13 is placed between the rear and front conductive layers 120 and 140, so that these layers 120 and 140 can be independently patterned and have appropriated thickness. To be more specific, the wiring layer 14 is thinned in order to minimize or increase the terminals while the buried conductors 12 are thick in order to reinforce the wiring layer 14. Insertion of the etching stop layer 13 enables the rear conductive layer 120 to be patterned without adversely affecting the thickness of the front conductive layer 140, thereby forming the buried conductors 12 in the shape of a bump.

[Method of Manufacturing Semiconductor Device]

The following describe how the semiconductor device of the first embodiment is assembled, with reference to FIGS. 1, 2, 16 and 17.

(1) First of all, the anisotropic conductive material 3 is applied to the semiconductor element mounting region 102 of the wiring substrate 1, and is heated at a predetermined temperature and pressed with a predetermined load for a predetermined period of time. In this state, the anisotropic conductive material 3 is temporarily in pressure contact with the wiring layer 14. The anisotropic conductive material 3 may be an anisotropic conductive film manufactured by Hitachi Chemical Co., Ltd.

(2) The semiconductor element 2 is placed on the anisotropic material 3, and has its bonding pads 20 aligned with electrodes 14C of the wiring substrate 1. Being a bare chip, the semiconductor element 2 is placed in a face-down state (i.e. in a flip-chip state) in order that the bonding pads 20 are in direct contact with the electrodes 14C of the wiring substrate 1. In this case, the semiconductor element 2 and the wiring substrate 1 are aligned in accordance with the contour of the semiconductor element 2 as an alignment mark. With respect to the wiring substrate 1, alignment targets can be made using the front conductive layer 141 in the process for forming the terminal 14A and wiring 14B. Since the front conductive layer 141 is very thin, the alignment targets can be made precisely.

(3) Thereafter, the semiconductor element 2 is brought into pressure contact with the wiring substrate 1 for the predetermined period of time at the predetermined heating temperature and with the predetermined load, thereby temporarily fixing the semiconductor element 2 to the wiring substrate 1. Then, the semiconductor element 2 is finally fixed to the wiring substrate 1, so that the semiconductor device as shown in FIGS. 1 and 2 can be completed. The electrodes 14C of the wiring substrate 1 can be reliably electrically connected to the bonding pads 20 of the semiconductor element 2 via the anisotropic conductive material 3. Further, the semiconductor element 2 itself is mechanically strongly attached to the wiring substrate 1 via the anisotropic conductive material 3. Alternatively, the semiconductor element 2 may be directly fixed to the wiring substrate 1 without the temporary fixing.

[Method of Manufacturing Semiconductor Device of Three-dimensional Structure]

Figure 18:
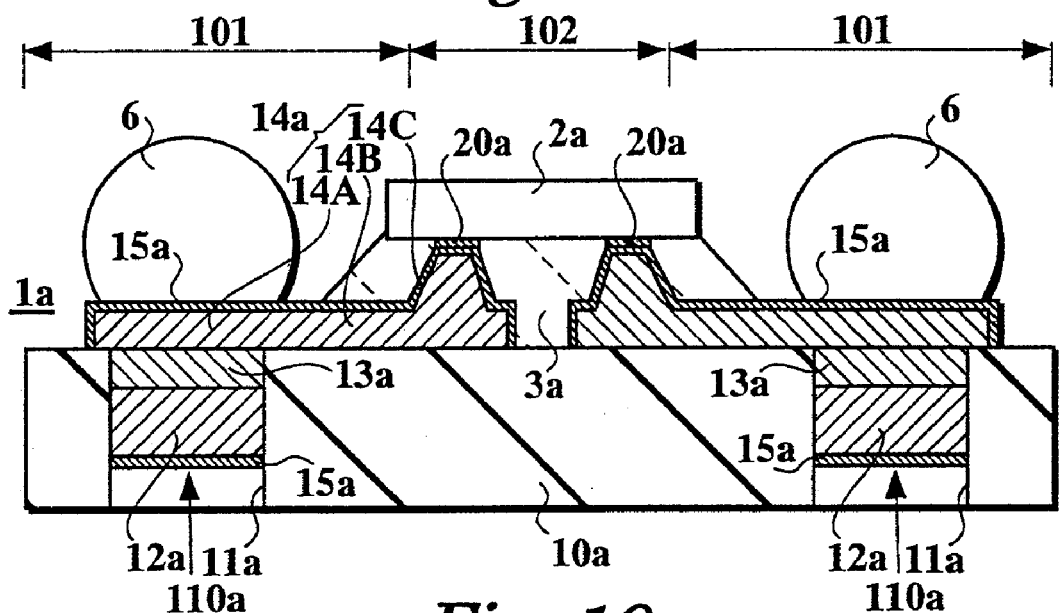
FIG. 18 is a cross section showing how a semiconductor device of the three-dimensional mounting structure is formed in the first embodiment.

The semiconductor device of the three-dimensional structure will be assembled as follows as shown in FIGS. 18 and 19.

(1) Referring to FIG. 18, inter-substrate connectors 6 are formed on terminals 14A of a first wiring substrate 1a. The inter-substrate connectors 6 are solder balls, which can be easily made using a solder ball machine manufactured by Hitachi Via Mechanics Co., Ltd.

(2) As shown in FIG. 19, a second wiring substrate 1b (identical to the first wiring substrate 1) is placed on the first wiring substrate 1a. The inter-substrate connectors 6 on the terminals 14A of the first wiring substrate 1a reach aligning parts 110b on the rear surface of the second wiring substrate 1b, so that the first and second wiring substrates 1a and 1b will be automatically aligned. The solder reflow is carried out in order to electrically and mechanically join the terminals 14A of the first wiring substrate 1a to the inter-substrate connectors 6, and electrically and mechanically join second buried conductors 12b, which expose via aligning parts 110b of the second wiring substrate 1b. The solder reflow is used, when the stacked first and second wiring substrates 1a and 1b are conveyed by a conveyor through a infrared ray reflowing and melting machine, according to a heating temperature and conveying speed and so on. After the solder reflow, the semiconductor device of the three-dimensional structure comprising first wiring substrate 1a, second wiring substrate 1b, third wiring substrate, . . . n-th wiring substrate that are stacked one over after another will be completed.

[Modified Example of Semiconductor Device]

Figure 20:
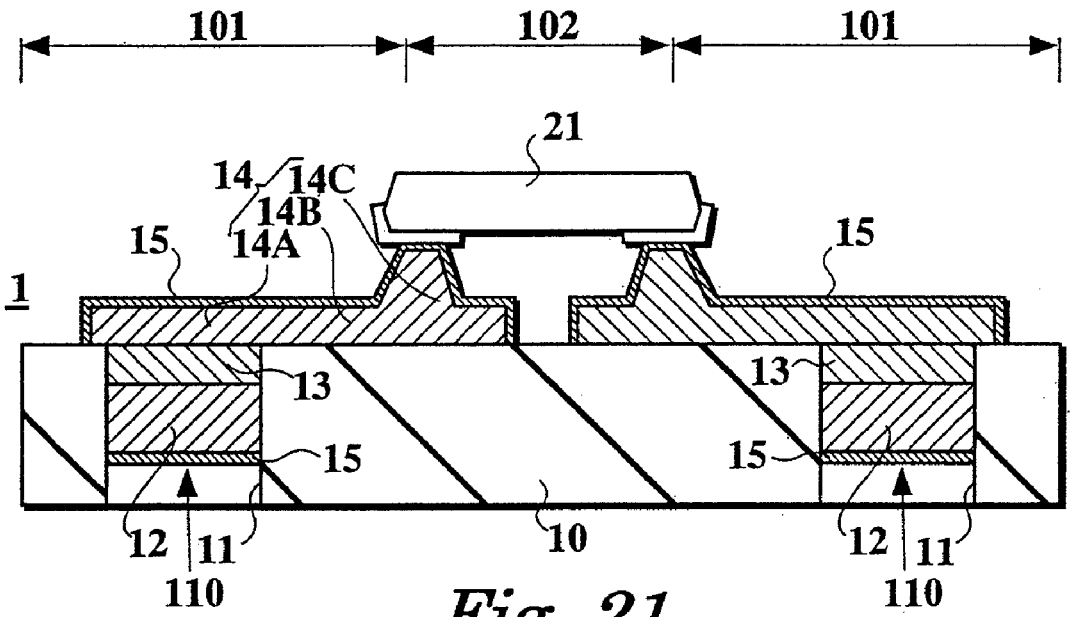
FIG. 20 is a cross section of a modified semiconductor device in the first embodiment.

In a modified semiconductor device, a packaged semiconductor element 21 is attached to terminals 14C of a wiring substrate 1 as shown in FIG. 20. The semiconductor element 21 has a lead-less chip carrier (LCC) structure in which a bare chip is resin-molded, although it may have any structure. Outer leads of the semiconductor element 21 are provided along a resin-molded portion. The bare chip is attached to inner leads by a face-up bonding method, although not shown in detail.

A plurality of wiring substrates 1 comprising the foregoing semiconductor elements 21 are stacked one over after another similarly to the semiconductor device shown in FIG. 19, thereby accomplishing the three-dimensional structure.

In the three-dimensional structure, not only a plurality of the semiconductor elements 2 or 21 are stacked one over after another but also wiring substrates including the semiconductor elements 2 and those including the semiconductor elements 21 may be alternately stacked. Further, the semiconductor element 21 may have the TAB structure.

Second Embodiment

Figure 21:
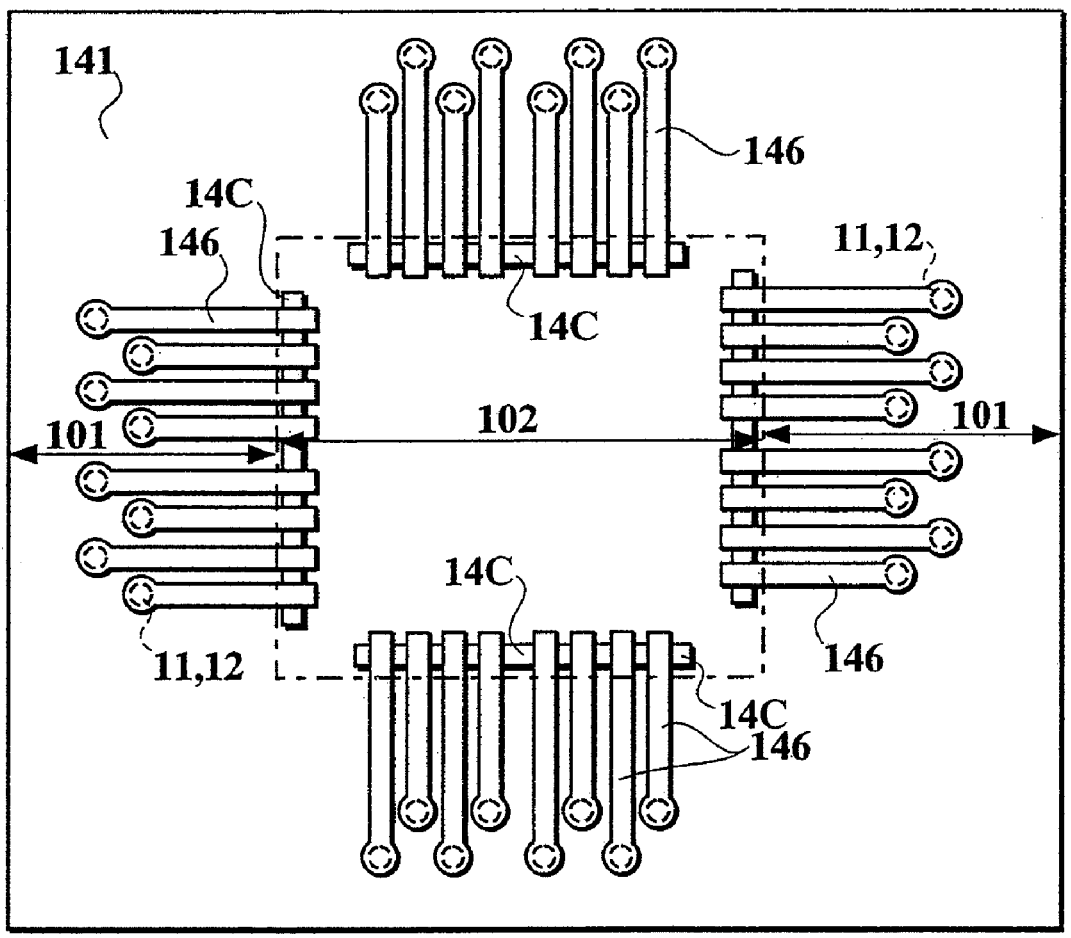
FIG. 21 is a top plan view of a wiring substrate in a second embodiment of the invention.

In a second embodiment, a wiring substrate 1 comprises electrodes 14C whose shape differs from that of the first embodiment. FIG. 21 is a top plan view of the wiring substrate 1 which is in the manufacturing process shown in FIG. 13.

A plurality of combined electrodes 14C are prepared. An etching mask 146 extends across these electrodes 14C, and is used to pattern a front conductive layer 141, thereby forming terminals 14A and wirings 14B. Thereafter, the electrodes 14C are separated.

The electrodes 14C is as wide as the wirings 14B, and can constitute a wiring substrate 1 which is suitable to arranging bonding pads of a semiconductor element 2 along the periphery of a semiconductor element mounting region 102 using a reduced number of pins and maintaining wide pitches between the bonding pads.

Third Embodiments

Figure 22:
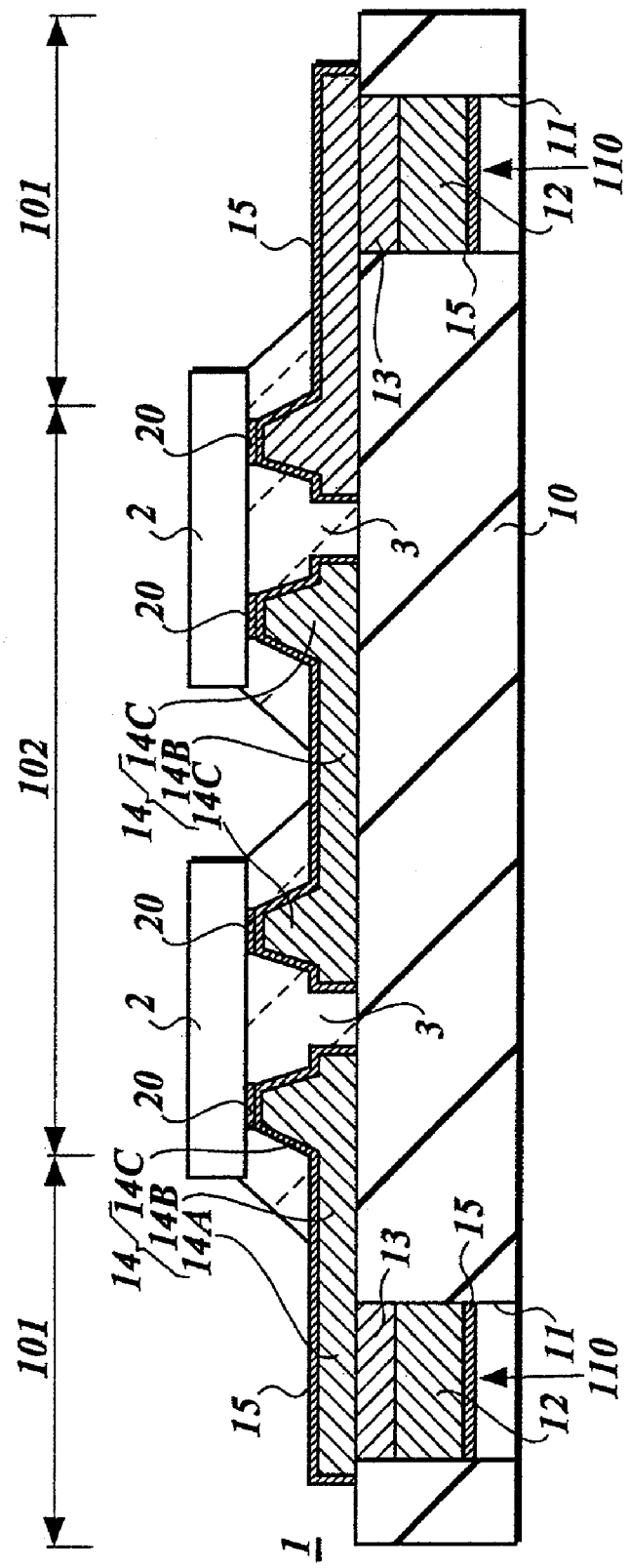
FIG. 22 is a cross section of a semiconductor device in a third embodiment of the invention.

In this embodiment, a semiconductor device has the MCM structure in which a plurality of semiconductor elements 2 are juxtaposed on one wiring substrate 1, as shown in FIG. 22. The semiconductor elements 2 may be memory devices or a combination of memory devices and logic devices.

Further, a plurality of wiring substrates 1a, 1b, 1c, 1d and so on may be stacked one over after another in order to accomplish the three-dimensional structure as shown in FIG. 19.

Fourth Embodiment

Figure 23:
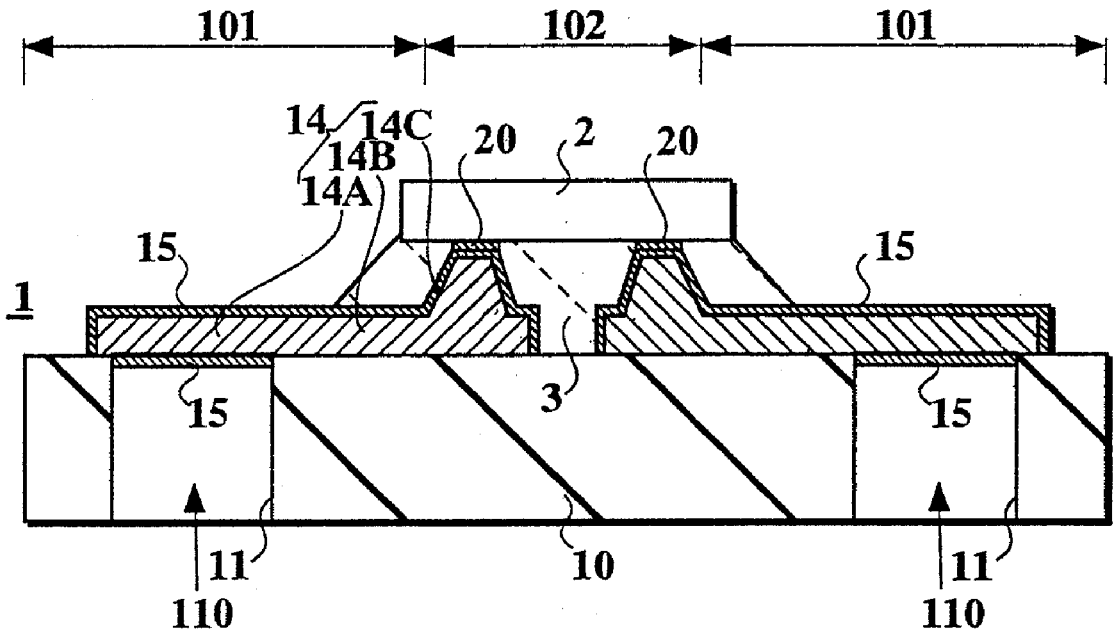
FIG. 23 is a cross section of a semiconductor device in a fourth embodiment of the invention.

Referring to FIG. 23, a semiconductor device comprises: an insulating base 10 having wiring regions 101 and a semiconductor element mounting region 102; connection holes 11 extending between first and second main surfaces of the insulating base 10; wiring layers 14 each of which has one end thereof connected to the connection holes 11 and the other end thereof extending to the first main surface of the insulating base 10; and a semiconductor element 2 connected to the wiring layer 14 at the semiconductor element mounting region 102. In this embodiment, no buried conductors 12 are present in the connection holes 11. Specifically, thin metal films 15 are selectively provided on the rear surfaces of the wiring layer 14 exposed in the connection holes 11, and are 5 µm to 30 µm thick nickel-plated films or a nickel-plated films covered by a 2 µm to 30 µm gold-plated film. These thin metal films 15 are made by the same process as that of the thin metal film 15 on the wiring layer 14 in the fourth embodiment.

The connection holes 11 have large spaces which can be used as aligning parts necessary for the three-dimensional structure. In other words, the aligning parts can be made without increasing the number of components and using a complicated structure. This embodiment is advantageous since it is easy to accomplish the three-dimensional structure by stacking a plurality of wiring substrates 1a, 1b and so on.

Fifth Embodiment

In this embodiment, a semiconductor device comprises: an insulating base 10 having wiring regions 101 and a semiconductor mounting region 102; buried conductors 12 extending between first and second main surfaces of the insulating base 10; wiring layers 14 each of which has one end thereof connected to the buried conductor 12 and the other end thereof extending to the semiconductor element mounting region 102; and a semiconductor element 2 connected to the wiring layers 14 at the semiconductor element mounting region 102.

Etching stop layers 13 are provided between the buried conductors 12 and terminals 14A of the wiring layers 14, are conductive and have an etching rate which is appropriate with respect to that of the buried conductors 12 and the wiring layers 14. For instance, the appropriate etching rate is secured if the buried conductors 12 and wiring layers 14 are made of copper (Cu), and the etching stop layers 13 are made of nickel (Ni).

Thin metal films 15 are provided on the bottoms of the buried conductors 12, and may be nickel-plated films or nickel-plated films which are covered by a gold-plated film or the like. The second main surface of the insulating base 2 is flush with the bottoms of the thin metal films 15.

Even when the second main surface of the insulating base 2 is flush with the bottoms of the thin metal films 15, the semiconductor device of this embodiment is effective in minimizing the terminals 14A and wirings 14B and increasing the number of terminals 14A as in the first embodiment. Therefore, this embodiment can minimize the semiconductor device and is suitable to the three-dimensional structure of the semiconductor device.

Figure 24:
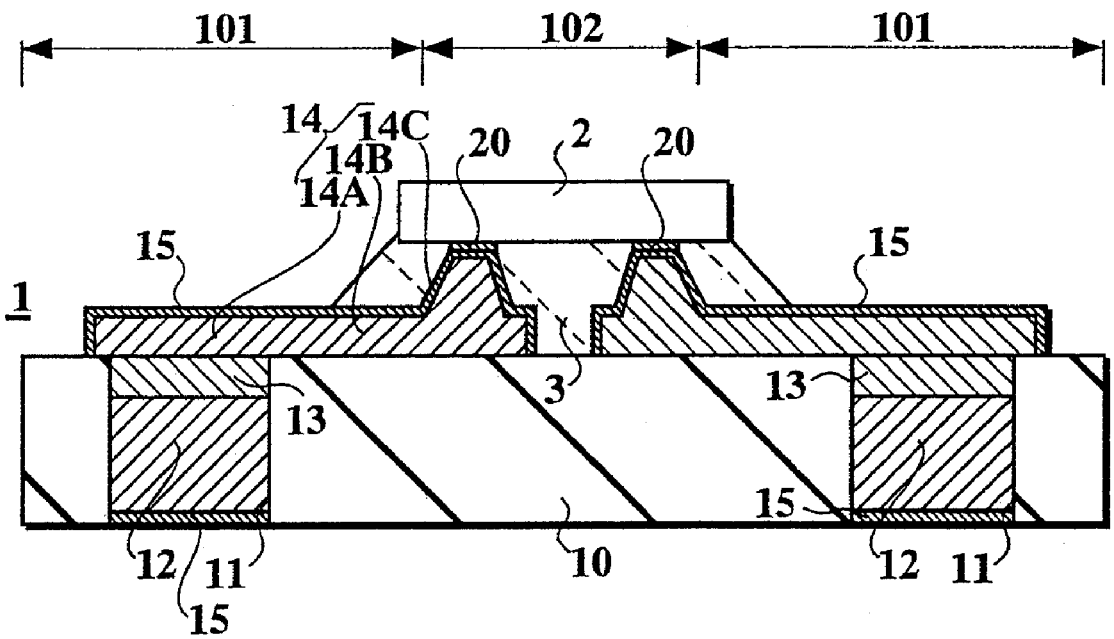
FIG. 24 is a cross section of a semiconductor device in a fifth embodiment of the invention.
Figure 25:
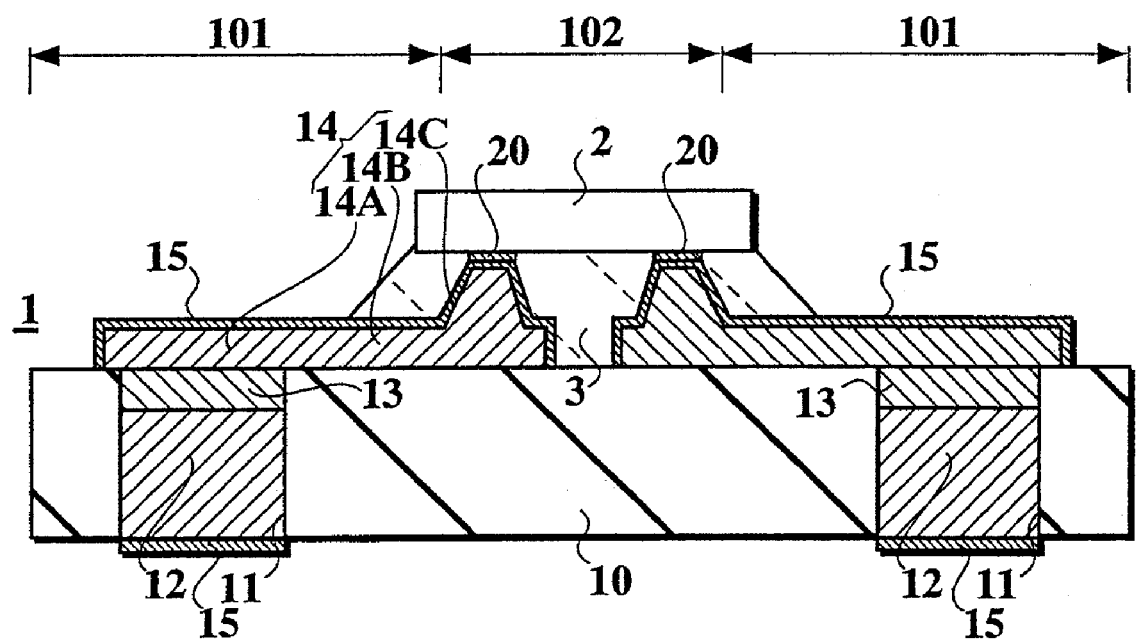
FIG. 25 is a cross section of a first modified semiconductor device in the fifth embodiment.

FIG. 25 shows a first modified example of the semiconductor device of the fifth embodiment. The semiconductor device comprises: an insulating base 10 having wiring regions 101 and a semiconductor element mounting region 102; buried conductors 12 extending between first and second main surfaces of the insulating base 10 at the wiring regions 101; wiring layers 14 each of which has one end thereof connected to the buried conductor 12 on the first main surface of the insulating base 10 and the other end thereof extending to the semiconductor element mounting region 102; and a semiconductor element 2 connected to the wiring layers 14 at the semiconductor element mounting region 102. Contrary to the semiconductor device shown in FIG. 24, the second main surface of the insulating base 10 is flush with the bottoms of the buried conductors 12. Further, thin metal film 15 which made of nickel or gold-plated and so on are provided on the bottoms of the buried conductors 12, and project from the second main surface of the insulating base 10.

Figure 26:
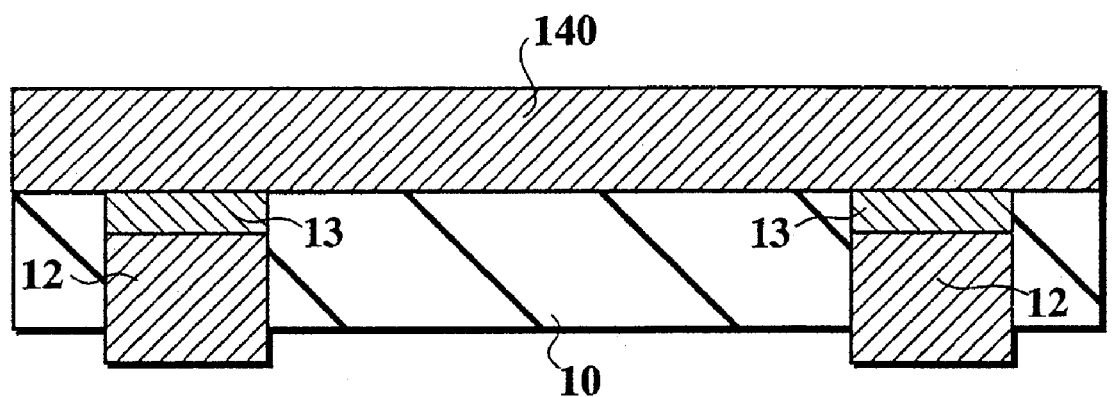
FIG. 26 is a cross section of a second modified wiring substrate in the fifth embodiment.
Figure 27:
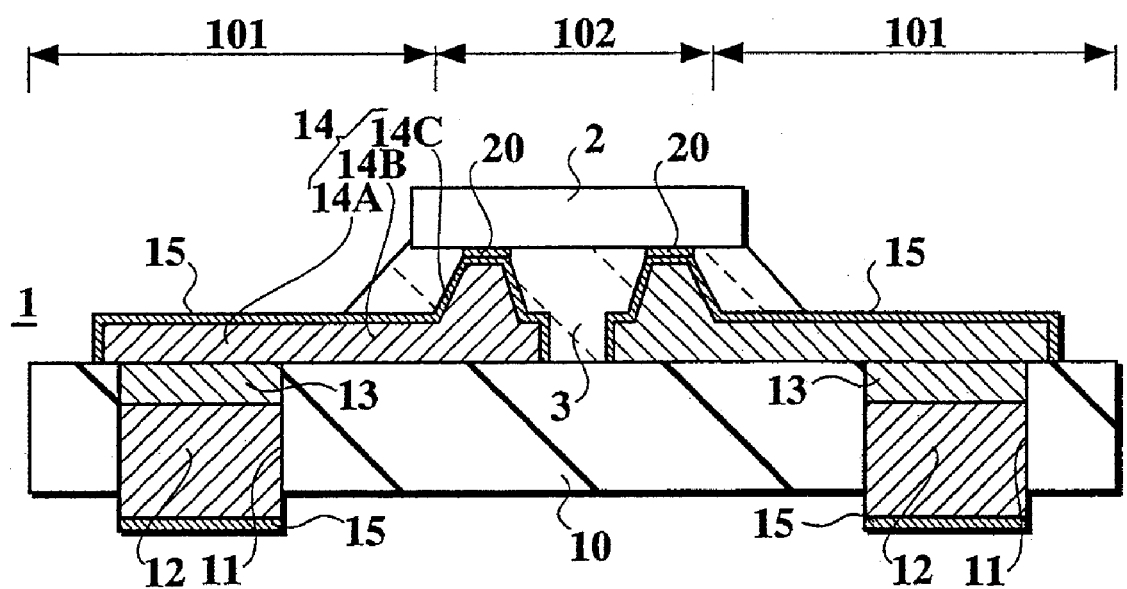
FIG. 27 is a cross section of a second modified semiconductor device in the fifth embodiment.

In a second modified semiconductor device, the bottoms of the buried conductors 12 may project with respect to the second main surface of the insulating base 10, as shown in FIG. 27. Referring to FIG. 26, the semiconductor device comprises: a front conductive layer 140; a plurality of buried conductors 12 electrically connected to the rear surface of the front conductive layer 140; and an insulating base 10 having a first main surface in contact with the rear surface of the front conductive layer 140, and a second main surface opposite to the first main surface and being in contact with side walls of the buried conductors 12. The insulating base 10 is thinner than the buried conductors 12 plus etching stop layers 13, i.e. the bottoms of the buried conductors 12 project from the second main surface of the insulating base 10. For instance, when a total thickness of each buried conductor 12 and each etching stop layer 13 is approximately 50 µm to 80 µm, preferably 65 µm, and a thickness of the insulating base 10 is approximately 30 µm to 60 µm, the semiconductor device can be easily structured as shown in FIG. 26.

In the structure shown in FIG. 27, a semiconductor element 2 is mounted on the front conductive layer 140 which is patterned in order to form wiring layers 14 provided with terminals 14A, wirings 14B and electrodes 14C. The semiconductor device of FIG. 27 comprises: an insulating base 10 having wiring regions 101 and a semiconductor element mounting region 102; buried conductors 12 extending between first and second main surfaces of the insulating base 10; wiring layers 14 each of which has one end thereof electrically connected to each buried conductor 12 and the other end thereof extending to the semiconductor element mounting region 102; and the semiconductor element 2 connected to the wiring layers 14 at the semiconductor element mounting region 102. The buried conductors 12 are provided with thin metal films 15 on their bottoms.

Needless to say, the semiconductor device of the fifth embodiment can have the three-dimensional structure in which a plurality of wiring substrates 1a, 1b and so on are stacked one over after another.

Other Embodiments

Although the present invention has been described and illustrated in detail, it is to be clearly understood that the same is by way of illustration and example only, and is not to be taken by way of limitation.

For instance, in the first to fifth embodiments, the connection holes and buried conductors are provided at the wiring regions. Alternatively, they may be provided at the semiconductor element mounting regions.

In the semiconductor devices having the three-dimensional structure shown in FIGS. 18 and 19, the inter-substrate connectors 6 may be solder paste which is made by the screen printing process. With the screen printing process, the solder paste is preferably prepared before the semiconductor element 2 is mounted on the wiring substrate 1. Otherwise, a screen printing mask may come into contact with the semiconductor element 2, if the semiconductor element 2 is mounted on the wiring substrate 1 beforehand. In such a case, it is not possible to secure a gap for the solder paste between the terminals 14A and the screen printing mask. Further, the inter-substrate connectors 6 may be an anisotropic conductive material (e.g. an anisotropic conductive film) identical to the anisotropic conductive material 3.

Figure 28:
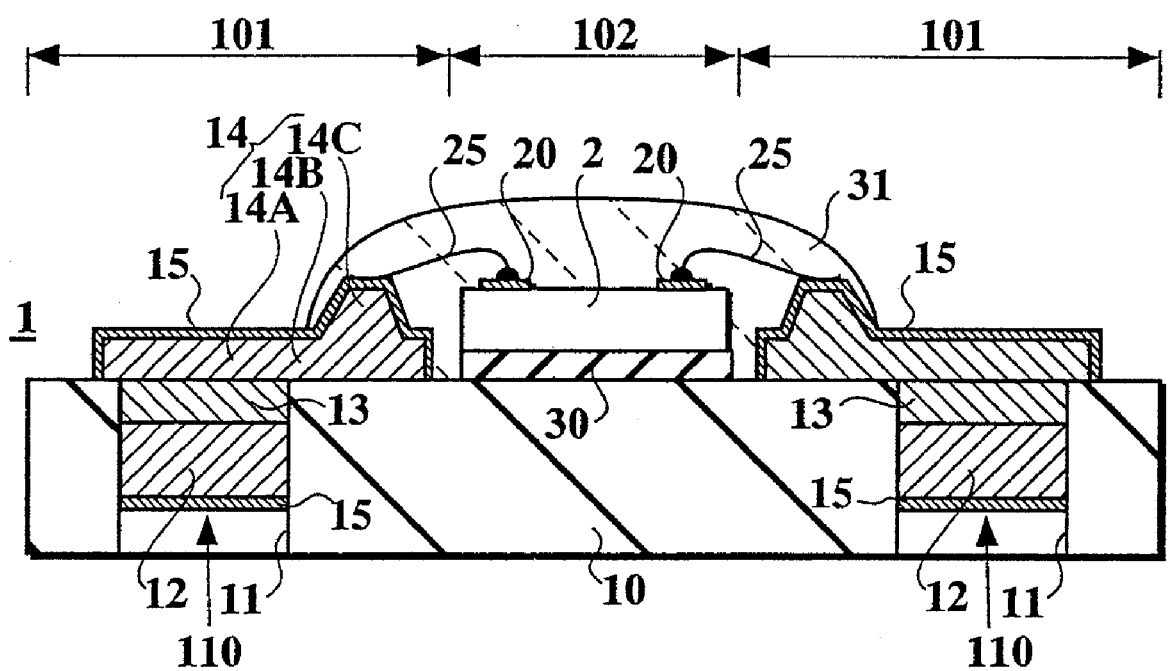
FIG. 28 is a cross section of a semiconductor device in a further embodiment of the invention.

As shown in FIGS. 1, 17 to 20, 22 to 25 or 27, the semiconductor devices provided with integrated circuits are mounted on the wiring substrates 1 in the face-down state (flip-chip state). However, the present invention is not always limited to the flip-chip mounting. As shown in FIG. 28, bonding wires 25 may be used to connect the bonding pads 20 around the semiconductor element (semiconductor chip) 2 to the electrodes 14C of the wiring layers 14. The semiconductor element 2 and the electrodes 14C are molded by a protective resin 31. When the bonding wires 25 are used, it is possible to reduce a height difference between the bonding pads 20 (first bonding area) and the electrodes 14C (second bonding area) because the electrodes 14C are thick. Therefore, bonding can be facilitated, and it is possible to prevent shorting between corners of the semiconductor element 2 and the bonding wires 25, which is effective in improving the manufacturing yield. Further, the foregoing components may be connected using the TAB tape.

The first embodiment is described by assuming that the integrated circuit is the silicon (Si) single crystal substrate (silicon single crystal chip). The integrated circuit may be a compound semiconductor made of gallium arsenal (GaAs) or the like.

In the foregoing embodiments, the wiring substrate 1 may be a printed circuit board, an integrated circuit board, a substrate for a liquid crystal display (e.g. a transparent glass substrate), or the like.

Further, the buried conductors 12 and the wiring layers 14 of the wiring substrate 1 may be made of different metallic materials.

The spirit and scope of the invention are to be limited only by the terms of the appended claims.

Effects of the Invention

The invention can provide the wiring substrate which is effective in downsizing the semiconductor device by minimizing and increasing the terminals, and in realizing the three-dimensional structure.

The invention can provide the semiconductor device which is effective in downsizing the semiconductor device by minimizing and increasing the terminals, and in realizing the three-dimensional structure.

Further, the invention can provide the method of manufacturing the wiring substrate which is effective in reducing the number of processes the product cost and manufacturing cost, and improving the manufacturing yield.

What is claimed:

1. A method of manufacturing a wiring substrate comprising:
    forming a front conductive layer containing conductive material on a rear conductive layer containing conductive material;
    selectively etching conductive material from a part of the rear conductive layer and forming a buried conductor;
    forming an insulating base in contact with the buried conductor;
    burying the buried conductor into the insulating base by applying pressure to the insulating base;
    selectively thinning a part of the front conductive layer;
    selectively thinning a part of the buried conductor; and
    patterning the selectively thinned front conductive layer and forming a wiring and a terminal.

2. The method of claim 1, wherein forming a front conductive layer on a rear conductive layer comprises: including an etching stop layer between the rear conductive layer and the front conductive layer, the etching stop layer having a slow etching rate compared with an etching rate of the rear conductive layer, and the front conductive layer having a slow etching rate compared with the etching stop layer.

3. The method of claim 1, wherein burying the buried conductor into the insulating base by applying a pressure to the insulating base comprises:
    forming a flattening member in contact with a rear surface of the insulating base, the rear surface being opposite to a front surface contacting the buried conductor;
    sandwiching the insulating base between the flattening member and the front conductive layer by applying the pressure from the flattening member; and
    removing the flattening member from the insulating base.

4. The method of claim 1, further comprising;
    polishing the insulating base until a surface of the buried conductor is exposed.

5. The method of claim 1, further comprising:
    roughening a surface of the front conductive layer after forming the buried conductor.

6. A method of manufacturing a wiring substrate comprising:
    forming a front conductive layer on a rear conductive layer;
    etching a part of the rear conductive layer to form a buried conductor;
    burying the buried conductor into an insulating base by applying pressure to the insulating base;
    polishing the insulating base until a surface of the buried conductors are exposed; and
    etching the front conductive layer to form a terminal, wiring and an electrode, which are formed of a single piece of material.

7. The method of claim 6, further comprising:
    roughening a surface of the front conductive layer after forming the buried conductor.

8. The method of claim 6, further comprising:
    selectively thinning a part of the buried conductor.

* * * * *